United States Patent
West et al.

(10) Patent No.: US 9,897,628 B2
(45) Date of Patent: Feb. 20, 2018

(54) METHOD AND APPARATUS FOR DOCKING A TEST HEAD WITH A PERIPHERAL

(71) Applicant: inTEST Corporation, Mount Laurel, NJ (US)

(72) Inventors: Christopher L. West, Medford, NJ (US); Charles P. Nappen, Woodbury, NJ (US); Steven J. Crowell, Merchantville, NJ (US)

(73) Assignee: inTEST Corporation, Mount Laurel, NJ (US)

(*) Notice: Subject to any disclaimer, the term of this patent is extended or adjusted under 35 U.S.C. 154(b) by 78 days.

(21) Appl. No.: 14/914,224

(22) PCT Filed: Sep. 18, 2014

(86) PCT No.: PCT/US2014/056246
§ 371 (c)(1),
(2) Date: Feb. 24, 2016

(87) PCT Pub. No.: WO2015/047857
PCT Pub. Date: Apr. 2, 2015

(65) Prior Publication Data
US 2016/0202292 A1    Jul. 14, 2016

Related U.S. Application Data

(60) Provisional application No. 61/884,345, filed on Sep. 30, 2013.

(51) Int. Cl.
*G01R 31/20*    (2006.01)
*G01R 1/04*    (2006.01)
(Continued)

(52) U.S. Cl.
CPC ......... *G01R 1/0416* (2013.01); *G01R 1/067* (2013.01); *G01R 31/2887* (2013.01)

(58) Field of Classification Search
CPC ........... G01R 31/2887; G01R 31/2891; G01R 31/2889; G01R 31/2851; G01R 1/0408;
(Continued)

(56) References Cited

U.S. PATENT DOCUMENTS

| | | | |
|---|---|---|---|
| 6,551,122 B2 * | 4/2003 | Bosy ................. | G01R 31/2887 439/348 |
| 7,109,733 B2 * | 9/2006 | Gudin ................ | G01R 31/2887 324/750.23 |

(Continued)

FOREIGN PATENT DOCUMENTS

DE    20003730 U1    6/2000

OTHER PUBLICATIONS

International Search Report for PCT/US2014/056246 dated Dec. 16, 2014.

*Primary Examiner* — Vinh Nguyen
(74) *Attorney, Agent, or Firm* — Caesar Rivise, PC

(57) ABSTRACT

A method and apparatus for docking a test head to a peripheral. A docking pin (150) is moved past a projection (803) in a catch (802). The docking pin is further moved until the catch rotates and the projection in the catch engages a notch or indentation (152, 156) in the docking pin. A piston (620) is moved on to the catch so that the catch is prevented from rotating. The piston is further moved so that the test head is docked to the peripheral.

13 Claims, 23 Drawing Sheets

(51) Int. Cl.
*G01R 1/067* (2006.01)
*G01R 31/28* (2006.01)

(58) Field of Classification Search
CPC .... G01R 31/2601; G01R 1/04; G01R 1/0416; G01R 1/067; G01R 1/07378; G01R 31/2831; G01R 31/2886; B66F 7/16; B66F 3/28; B66F 3/825; B25J 9/041; B25J 19/0012; G01D 11/30; G05D 16/20; G06F 13/409
See application file for complete search history.

(56) References Cited

U.S. PATENT DOCUMENTS

| | | | | |
|---|---|---|---|---|
| 7,221,175 | B2* | 5/2007 | Ramamoorthi | G01R 31/2887 324/750.25 |
| 7,382,145 | B2* | 6/2008 | Thurmaier | G01R 31/2887 269/309 |
| 2004/0018048 | A1* | 1/2004 | Sausen | B23Q 1/0072 403/316 |
| 2007/0030018 | A1 | 2/2007 | Thurmaier | |

* cited by examiner

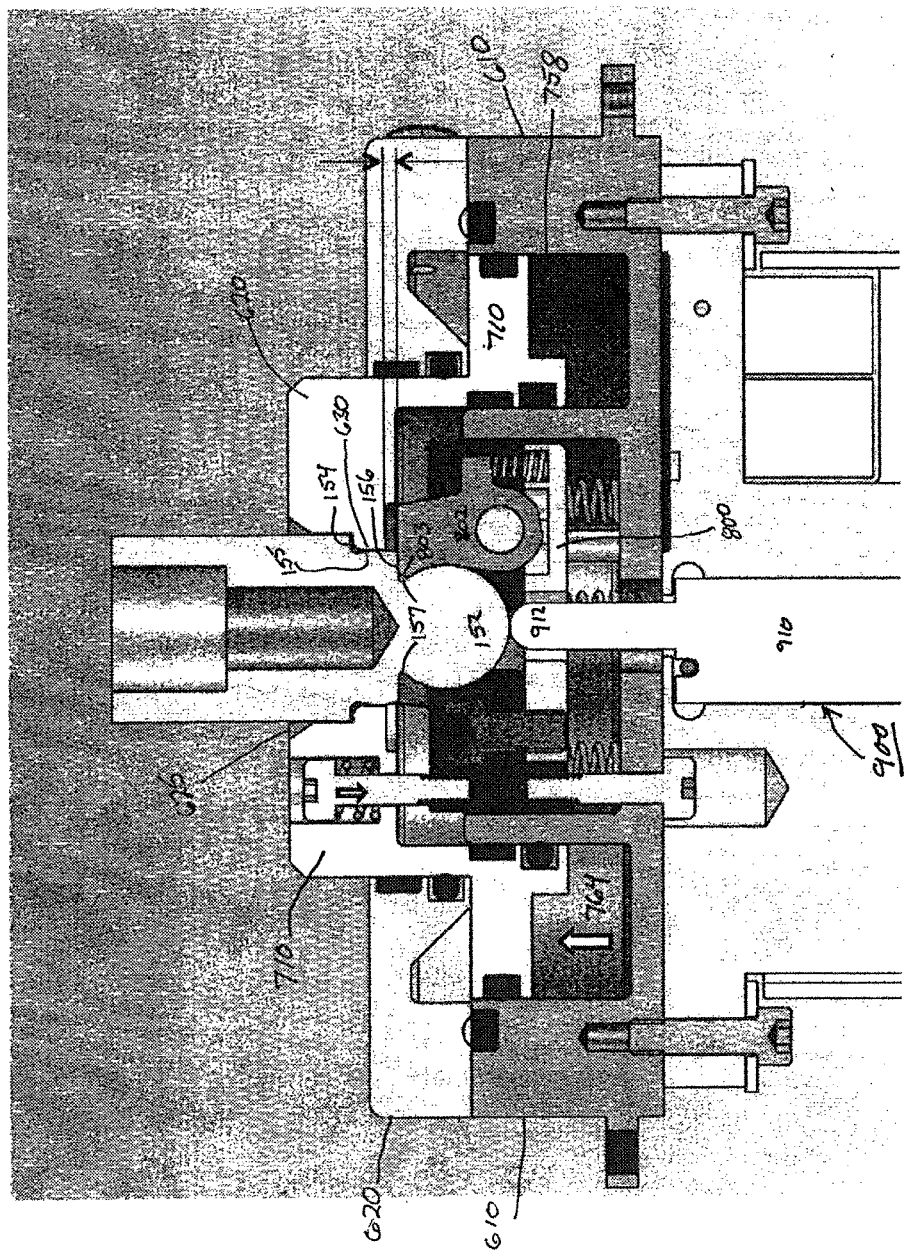

METHOD AND APPARATUS FOR DOCKING A TEST HEAD WITH A PERIPHERAL

CROSS-REFERENCE TO RELATED APPLICATION

This application claims priority to U.S. Provisional Application No. 61/884,345, entitled "METHOD AND APPARATUS FOR DOCKING A TEST HEAD WITH A PERIPHERAL," filed on Sep. 30, 2013, the contents of which are incorporated fully herein by reference.

FIELD OF THE INVENTION

The invention relates to testing integrated circuits or electronic devices, and more particularly relates to docking a test head with a peripheral.

BACKGROUND OF THE INVENTION

In the manufacture of integrated circuits (ICs) and other electronic devices, testing with automatic test equipment (ATE) is performed at one or more stages of the overall process. Special handling apparatus is used which places the device to be tested into position for testing. In some cases, the special handling apparatus may also bring the device to be tested to the proper temperature and/or maintain it at the proper temperature as it is being tested. The special handling apparatus is of various types including, for example, "probers" for testing unpackaged devices on a wafer and "device handlers" for testing packaged parts; herein, the terms "handling apparatus" or "peripherals" will be used to refer to all types of such apparatus. The electronic testing itself is provided by a large and expensive ATE system that includes a test head, which is required to connect to and dock with the handling apparatus. The Device Under Test (DUT) requires precision, high-speed signals for effective testing; accordingly, the "test electronics" within the ATE which are used to test the DUT are typically located in the test head which must be positioned as close as possible to the DUT. DUTs are continually becoming increasingly complex with increasing numbers of electrical connections. Furthermore, economic demands for test system throughput have led to systems that test a number of devices in parallel.

These requirements have driven the number of electrical connections between a test head and a peripheral into the thousands and the size and weight of test heads has grown accordingly. Presently, test heads may weigh from several hundred pounds to as much as two or three thousand pounds. The test head is typically connected to the ATE's stationary mainframe by means of a cable, which provides conductive paths for signals, grounds, and electrical power. In addition, the test head may require liquid coolant to be supplied to it by way of flexible tubing, which is often bundled within the cable. Further, certain contemporary test heads are cooled by air blown in through flexible ducts or by a combination of both liquid coolants and air. In the past, test systems usually included a mainframe housing power supply instruments, control computers and the like. Electrical cables couple the mainframe electronics to "pin electronics" contained in the test head. The cabling between the mainframe and the test head increases the difficulty of manipulating the test head precisely and repeatably into a desired position. Several contemporary systems now place virtually all of the electronics in the movable test head while a mainframe may still be employed to house cooling apparatus, power supplies, and the like. Thus, the increased number and spatial density of electrical contacts to be mated combined with the increased size and weight of the test head and its cable make it more difficult to accurately and repeatably position a test head with respect to a peripheral.

In testing complex devices, either individually or many in parallel, hundreds or thousands of electrical connections have to be established between the test head and the DUT or DUTs. These connections are usually accomplished with delicate, densely spaced contacts. In testing unpackaged devices on a wafer, the actual connections to the DUT or DUTs are typically achieved with needle-like probes mounted on a probe card. In testing packaged devices, it is typical to use one or more test sockets mounted on a "DUT socket board." Herein, the term "DUT adapter" will be used to refer to the unit that holds the part or parts that make actual electrical connections to the DUT or DUTs. The DUT adapter must be precisely and repeatably positioned with respect to the peripheral in order that each of a number of DUTs may be placed, in turn, into position for testing.

Test systems may be categorized in terms of how the DUT adapter is held. Presently, in many systems the DUT adapter is fixed appropriately to the handling apparatus, which typically includes reference features to aid in accurately locating it. Herein, these systems will be referred to as "peripheral-mounted-DUT-adapter" systems. In other systems the DUT adapter is attached to the test head and positioned with respect to the handling apparatus by appropriately positioning (i.e., docking) the test head. These latter systems will be referred to as "test-head-mounted-DUT-adapter" systems. There are two possible subcategories of test-head-mounted-DUT-adapter systems. In the first subcategory, the DUT or DUTs are positioned before the test head is positioned or docked. Thus, the act of positioning the test head brings the connection elements into electrical contact with the DUT. This arrangement may be suitable for wafer scale testing, where the peripheral first positions a wafer and then the test head and DUT adapter (here a probe card configured to probe many or all of the devices on the wafer) is then positioned with respect to the wafer so that the needle-like probes contact the DUTs. In the second subcategory, the test head and DUT adapter are positioned or docked first, and this is followed by the peripheral moving DUTs in turn into position for testing as the DUT adapter remains in position.

It is to be noted that the DUT adapter must also provide connection points or contact elements with which the test head can make corresponding electrical connections. This set of connection points will be referred to as the DUT adapter electrical interface. Further, the test head is typically equipped with an electrical interface unit that includes contact elements to achieve the connections with the DUT adapter electrical interface. Typically, the test head interface contact elements are spring-loaded "pogo pins," and the DUT adapter receiving contact elements are conductive landing pads. However, other types of connection devices may be incorporated for example for RF and/or critical analog signals. In some systems such other types of connectors are used in combination with pogo pins. The cumulative force required to compress hundreds or thousands of pogo pins and/or to mate other styles of contacts can become very high. This can be objectionable as the force required to bring the contacts into connection may be unreasonable and the force placed on the DUT adapter could cause undesirable deflections. Accordingly, alternative connection techniques, such as zero-insertion-force techniques, have been under development. For example, U.S. Pat. No. 6,833,696 (assigned to Xandex, Inc.) discloses a system having electrical contacts formed on substrates combined with mechanisms to bring corresponding contacts into engagement without placing undue force on a probe card or DUT board. It is further anticipated that in the future Micro Electromagnetic Machine (MEMS) techniques may be employed to form electrical contacts as an extension of their present use in fabricating probe cards. Overall, the contacts are very fragile and delicate, and they must be protected from damage.

In overview (more detailed descriptions will be provided further on) docking is the process of maneuvering the test head into position with respect to the peripheral for testing. In peripheral-mounted-DUT-adapter systems, docking includes properly and precisely conjoining the contact elements of the test head interface unit with their respective connection elements on the DUT adapter. In these systems, the delicate and fragile test head interface contacts must be afforded protection during the positioning and docking process. However, in test-head-mounted-DUT-adapter systems, the goal of docking is to precisely position and locate the DUT adapter with respect to the peripheral and/or DUTs. Also to be noted in test-head-mounted-DUT-adapter systems, the conjoining of the test head interface contact elements with the DUT adapter connection elements is accomplished when the DUT adapter is attached to the test head, and the contact elements are thus protected. However, the very delicate, needle-like probes of a probe card or the fragile, precisely manufactured test sockets are exposed during positioning and docking, and these too require protection.

Test head manipulators may be used to maneuver the test head with respect to the handling apparatus. Such maneuvering may be over relatively substantial distances on the order of one meter or more. The goal is to be able to quickly change from one handling apparatus to another or to move the test head away from the present handling apparatus for service and/or for changing interface components. When (as outlined above) the test head is held in a position with respect to the handling apparatus such that all of the connections between the test head the DUT adapter have been achieved and/or the DUT adapter is in its proper position, the test head is said to be "docked" to the handling apparatus. In order for successful docking to occur, the test head must be precisely positioned in six degrees of freedom with respect to a Cartesian coordinate system. Most often, a test head manipulator is used to maneuver the test head into a first position of coarse alignment within approximately a few centimeters of the docked position, and a "docking apparatus" is then used to achieve the final precise positioning.

Typically, a portion of the docking apparatus is disposed on the test head and the rest of it is disposed on the handling apparatus. Because one test head may serve a number of handling apparatuses, it is usually preferred to put the more expensive portions of the docking apparatus on the test head. The docking apparatus may include an actuator mechanism that draws the two segments of the dock together, thus docking the test head; this is referred to as "actuator driven" docking. The docking apparatus, or "dock" has numerous important functions, including: (1) alignment of the test head with the handling apparatus, including the precise alignment of electrical contacts, (2) sufficient mechanical advantage and/or actuator power to pull together, and later separate (i.e., undock), the test head and the handling apparatus, (3) providing pre-alignment protection for electrical contacts during both docking and undocking operations, and (4) latching or holding the test head and the handling apparatus together.

According to the inTEST Handbook (5th Edition© 1996, inTEST Corporation), "Test head positioning" refers to the easy movement of a test head to a handling apparatus combined with the precise alignment to the handling apparatus required for successful docking, and undocking. A test head manipulator may also be referred to as a test head positioner. A test head manipulator combined with an appropriate docking means performs test head positioning. This technology is described, for example, in the aforementioned inTEST Handbook. This technology is also described in numerous patent publications, for example a partial list includes U.S. Pat. Nos. 7,728,579, 7,554,321, 7,276,894, 7,245,118, 5,931,048, 5,608,334, 5,450,766, 5,030,869, 4,893,074, 4,715,574, and 4,589,815 as well as WIPO publications such as WO05015245A2 and WO08103328A1, which are all incorporated by reference for their teachings in the field of test head positioning systems. The foregoing patents and publications relate primarily to actuator-driven docking. Test head positioning systems are also known where a single apparatus provides both relatively large distance maneuvering of the test head and final precise docking. For example, U.S. Pat. No. 6,057,695 to Holt et al., and U.S. Pat. Nos. 5,900,737 and 5,600,258 to Graham et al., which are all incorporated by reference, describe a positioning system where docking is "manipulator-driven" rather than actuator-driven.

As previously stated, the goal of test head docking is to properly locate and position the test head with respect to the peripheral. The peripheral normally includes features, such as mounting surfaces that define a "peripheral docking plane." The electrical contacts that connect to the DUT (and hence the DUT adapter, DUT socket board or probe card) must lie in a plane parallel to the peripheral docking plane. To facilitate docking, the docking apparatus that is mounted on the peripheral is typically located on a flat metallic plate that is attached to the peripheral such that its outer surface is parallel to the peripheral docking plane. Also the peripheral may include other reference features, such as precisely located pins or receptacles, to enable properly locating the DUT adapter.

Similarly, a "test-head docking plane" may be associated with the test head. The test head interface contact elements are typically arranged in a plane parallel to the test-head docking plane. A Cartesean coordinate system may be associated with either the test-head or peripheral docking plane such that the X and Y-axes lie in a plane parallel to the docking plane and the Z axis is perpendicular to the docking plane. Distances in the Z direction may referred to as height. It is to be noted that there may be more than one set of test head interface contact elements with the plane of each set being at a different height with respect to the docking plane. In the remainder of this document the term "docking plane" is used without a modifier it refers to the peripheral docking plane.

When properly docked, the test-head docking plane is substantially parallel to the peripheral docking plane. The process of achieving this relationship is often known as planarization and the result may be referred to as "docked planarity." Also, when properly docked, the test head is at a predetermined preferred "docked distance" from the peripheral. Achieving docked planarity and docked distance requires three degrees of motion freedom of the test head, namely: rotations about axes parallel to the X and Y axes associated with the test-head docking plane and linear motion along the Z axis. Finally, when properly docked, the two docking planes will be aligned in the remaining three degrees of freedom corresponding to the X and Y directions as well as with respect to rotation about an axis parallel to the Z axis.

In the typical actuator-driven positioning system, an operator controls the movement of the manipulator to maneuver the test head from one location to another. This may be accomplished manually by the operator exerting force directly on the test head in systems where the test head is fully balanced in its motion axes, or it may be accomplished through the use of actuators directly controlled by the operator. In several contemporary systems, the test head is maneuvered by a combination of direct manual force in some axes and by actuators in other axes.

In order to dock the test head with the handling apparatus, the operator must first maneuver the test head to a "ready-to-dock" position, which is close to and in approximate alignment with its final docked position. The test head is further maneuvered until it is in a "ready-to-actuate" position where the docking actuator can take over control of the test head's motion. The actuator can then draw the test head into its final, fully docked position. In doing so, various alignment features provide final alignment of the test head. A dock may use two or more sets of alignment features of different types to provide different stages of alignment, from initial to final. It is generally preferred that the test head be aligned in five degrees of freedom before the fragile electrical contacts make mechanical contact. The test head may then be urged along a straight line, which corresponds to the sixth degree of freedom, that is perpendicular to the plane of the interface and peripheral docking plane.

As the docking actuator is operating (and while the dock alignment features are not imposing constraints), the test head is typically free to move compliantly in several if not all of its axes to allow final alignment and positioning. For manipulator axes which are appropriately balanced and not actuator driven, this is not a problem. However, actuator driven axes generally require that compliance mechanisms be built into them. Some typical examples are described in U.S. Pat. Nos. 5,931,048, 5,949,002, 7,084,358, and 7,245,118 as well as WIPO publication WO08137182A2 (all incorporated by reference). Often compliance mechanisms, particularly for non-horizontal unbalanced axes, involve spring-like mechanisms, which in addition to compliance add a certain amount of resilience or "bounce back." Further, the cable connecting the test head with the ATE mainframe is also resilient leading to further bounce back effects. As the operator is attempting to maneuver the test head into approximate alignment and into a position where it can be captured by the docking mechanism, he or she must overcome the resilience of the system, which can often be difficult in the case of very large and heavy test heads. Also, if the operator releases the force applied to the test head before the docking mechanism is appropriately engaged, the resilience of the compliance mechanisms may cause the test head to move away from the dock.

U.S. Pat. No. 4,589,815 to Smith (incorporated by reference), discloses a prior art docking mechanism. The docking mechanism illustrated in FIGS. 5A, 5B, and 5C of the '815 patent uses two guide pin and receptacle combinations to provide final alignment and two circular cams. The guide pin receptacles are located in gussets that also hold cam followers which engage with the cams. To achieve a ready-to-actuate position, the cams must be fitted between the gussets such that the cam followers can engage helical cam slots located on the cams' cylindrical surfaces. Fitting the cams between the gussets provides a first, coarse alignment and also provides a degree of protection to the electrical contacts, probes or sockets as the case may be. When the cams are rotated by handles attached to them, the two halves of the dock are pulled together with the guide pins becoming fully inserted into their mating receptacles. A wire cable links the two cams so that they rotate in synchronism. The cable arrangement enables the dock to be operated by applying force to just one or the other of the two handles. The handles are accordingly the docking actuator in this case.

The basic idea of the '815 dock has evolved as test heads have become larger into docks having three or four sets of guide pins and circular cams. These are known as three-point and four-point docks respectively. FIGS. 1A and 1B of the present application illustrate a prior-art four-point dock having four gussets 116, four guide-pins 112, four complementary receptacles 112a and four circular cams 110. (This apparatus is described in more detail later.) Although such "four-point" docks have been constructed having an actuator handle 135 attached to one or more of the four cams 110, the dock shown in FIG. 1A incorporates a single actuator handle 135 that operates a cable driver 132. When the cable driver 132 is rotated by the handle 135, the cable 115 is moved so that the four cams 110 rotate in a synchronized fashion. Cams 110 engage cam followers 110a, which are attached to gussets 116. This arrangement places a single actuator handle in a convenient location for the operator. Also, greater mechanical advantage can be achieved by appropriately adjusting the ratio of the diameters of the cams to the diameter of the cable driver. In these docks, the interaction between the guide pins 112 and their corresponding receptacles 112a determines the position of the docked test head in three degrees of freedom in a plane parallel to the peripheral docking plane. As the cams 110 are rotated, the interaction between the cam followers 110a and the cam slots 129 control the remaining three degrees of freedom, namely the planarity of the test head with respect to the peripheral docking plane and the distance between the test head and the peripheral 108. When the cams 110 have been fully rotated, the gussets 116, which are attached to the peripheral 108, bear against the test head 100, establishing the final "docked distance" between test head 100 and peripheral 108 as well as the final "docked planarity" of the test head.

Other prior art docks, such as those manufactured by Reid Ashman, Inc., are similar in concept but utilize linear cams in lieu of circular cams and solid links instead of cables to synchronously drive the cams. Another scheme that utilizes linear cams but which is actuated by pneumatic elements is described in U.S. Pat. No. 6,407,541 to Credence Systems Corporation (incorporated by reference). In the '541 patent, "docking bars" serve a similar purpose to the previously described "gussets." However, when the test head is docked, the docking bars do not bear against the unit being docked to; thus, the interaction between the cam followers and the cams solely determines the docked distance and docked planarity.

Still other variations of docks are known. For example, a partially automated dock that may be operated in either partially or fully powered modes and which incorporates cable-driven circular cams is disclosed in U.S. Pat. Nos. 7,109,733 and 7,466,122 (both incorporated by reference), both to the present assignee. A further dock configuration including solid link driven circular cams and which may be powered is described in WIPO publication WO2010/009013A2 (incorporated by reference), also to the present assignee. These docks utilize guide pins and receptacles to establish position within the plane and gussets or the equivalent to establish docked planarity and the docked distance between the test head and the peripheral.

Still another variation is described in U.S. Pat. No. 6,870,363 to Thurmaier, which is also included by reference. In this scheme docking pins are disposed upon the handling device and docking pin receivers are respectively disposed on the test head (or vise versa). In order to dock, the pins are axially inserted into the receivers, where they are captured by an arrangement of balls operated by a clamping device. All pins are captured simultaneously. Actuation apparatus may then draw the pins, and thus the test head, into a docked position.

Additionally, the docks described in U.S. Pat. Nos. 5,654,631 and 5,744,974 utilize guide pins and receptacles to align the two halves. However, the docks are actuated by vacuum devices, which urge the two halves together when vacuum is applied. The two halves remain locked together so long as the vacuum is maintained. However, the amount of force that can be generated by a vacuum device is limited to the atmospheric air pressure multiplied by the effective area. Thus, such docks are limited in their application.

U.S. Pat. Nos. 7,235,964 and 7,276,895 (both incorporated by reference) to the present assignee describe docks that use relatively large alignment pins (as illustrated in FIG. 14 of the '895 patent), which are typically attached to the peripheral. The diameter of the pins is relatively narrow at their distal ends and is larger at the interior ends. Also, two cam followers are attached to the pins near the point where they are attached to the peripheral. Camming mechanisms, employing linear cams, are attached to the test head. The distal ends of the alignment pins may be first inserted into the camming mechanisms to provide a first stage of course alignment. As the test head is urged closer to the peripheral, the larger diameter enters the camming mechanism to provide closer alignment. As the test head is further urged towards the peripherals, the cam followers eventually engage the cams, which may then be actuated to pull the two halves into a final docked position. No gussets are involved; the docked distance and docked planarity are solely determined by the interaction between the cams and cam followers. Further, it is necessary for the camming mechanisms to serve as pin receptacles, providing sufficient interaction with the pins to position the test head in three degrees of freedom parallel to the peripheral docking plane.

SUMMARY OF INVENTION

A method and apparatus for docking a test head to a peripheral. A docking pin is moved past a projection in a catch. The docking pin is further moved until the catch rotates and the projection in the catch engages a notch or indentation in the docking pin. A piston is moved on to the catch so that the catch is prevented from rotating. The piston is further moved so that the test head is docked to the peripheral.

BRIEF DESCRIPTION OF THE DRAWINGS

FIG. 9B is a further cross sectional view which shows the docking pin inserted into the opening of the piston and after a latch has engaged the ball end of the docking pin.

DETAILED DESCRIPTION

Figure 1A:
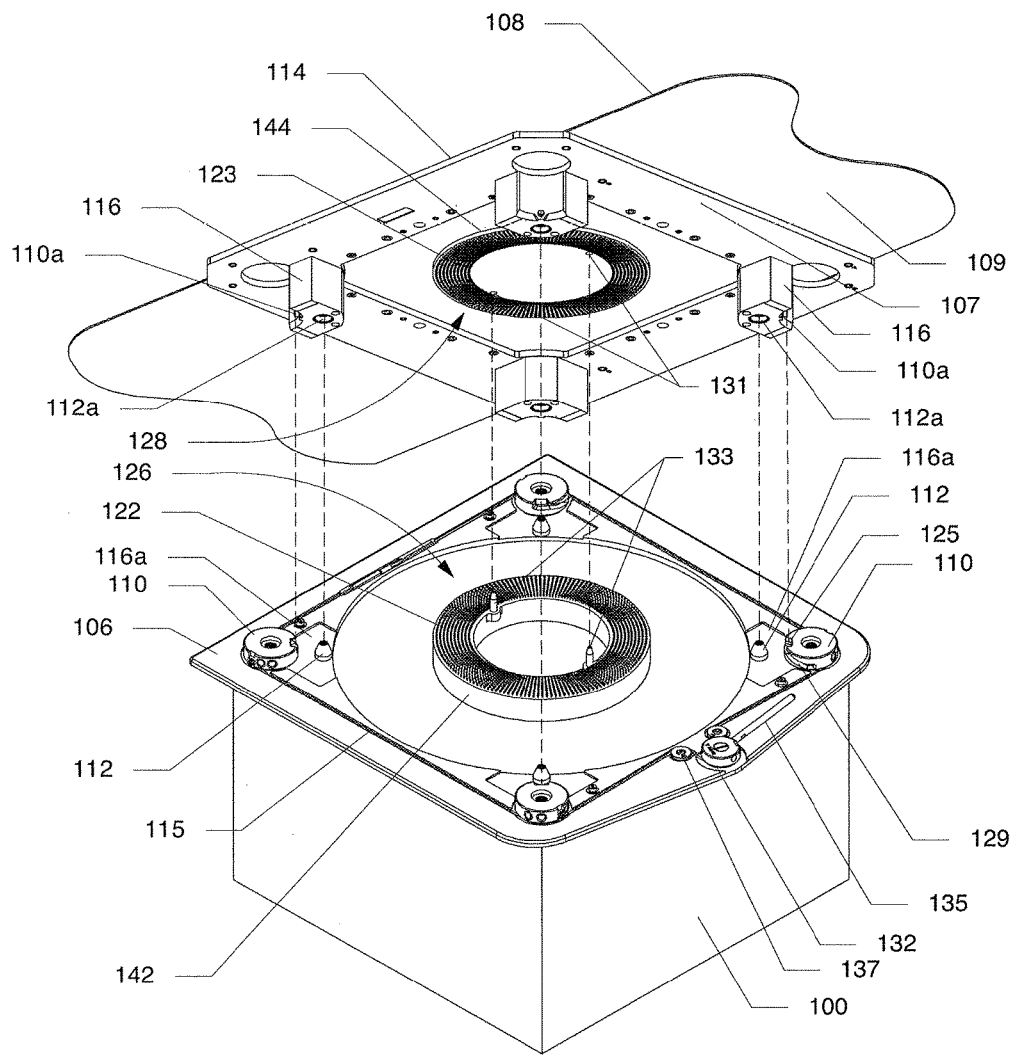
FIG. 1A is a perspective view of a prior art test head and peripheral with docking apparatus added.

In all of the docks that have been mentioned, including both actuator driven and manipulator driven, alignment of the test head within a plane parallel to the docking plane is determined by the fit of guide pins within their respective receptacles. In order to facilitate many cycles of docking and undocking, the guide pins are usually designed to have a diameter that is a few thousandths on an inch smaller than that of their receptacle. Thus the accuracy and repeatability of the final docked position of the test head is limited to at least typically three to five thousandths of an inch with respect to the peripheral docking plane. While this has been acceptable for many past and contemporary test systems, the demand for systems having greatly improved accuracy and especially repeatability is expected to grow.

As previously indicated, the purpose of docking in a peripheral-mounted-DUT-adapter system is to precisely mate the test head electrical interface with the DUT adapter electrical interface. Each electrical interface and defines a plane, which is typically, but not necessarily, nominally parallel with the distal ends of the electrical contacts. When docked these two planes must be parallel with one another. Normally, the DUT adapter is fabricated as a planar circuit board and is desirably fixed to the peripheral in a plane parallel to the peripheral's docking plane. Thus, when docked, the plane of the test head electrical interface must also be parallel to the peripheral docking plane. In order to prevent damage to the electrical contacts, it is preferred to first align the two interfaces in five degrees of freedom prior to allowing the electrical contacts to come into mechanical contact with one another. If in the docked position the defined planes of the interfaces are parallel with the X-Y plane of a three-dimensional Cartesian coordinate system, alignment must occur in the X and Y axes and rotation about the Z axis (Theta Z or Yaw), which is perpendicular to the X-Y plane, in order for the respective contacts to line up with one another. Additionally, the two planes may be made parallel by rotational motions about the X and Y axes (Pitch and Roll). The process of making the two electrical interface planes parallel with one another is called "planarization" of the interfaces; and when it has been accomplished, the interfaces are said to be "planarized" or "co-planar." Once planarized and aligned in X, Y and Theta Z, docking proceeds by causing motion in the Z direction perpendicular to the peripheral docking plane.

Similarly, the purpose of docking in test-head-mounted-DUT-adapter systems is to precisely position the test head so that the DUT adapter is properly located with respect to the peripheral. The DUT adapter's probe tips or socket contacts constitute an electrical test interface, which defines a plane that must be planarized with the peripheral's docking plane. Further, the electrical test interface must be precisely aligned with respect to the X and Y axes of the docking plane and with respect to rotation about the Z axis. As with the previous case, it is preferred that alignment in these five degrees of freedom occurs before final positioning in the Z direction.

In the process of docking, the test head is first maneuvered into proximity of the peripheral. Further maneuvering brings the test head to a "ready to dock" position where, in many systems, some first coarse alignment means is approximately in position to be engaged. Still further maneuvering will bring the test head to a "ready to actuate position," where the docking mechanism may be actuated. At the ready to actuate position, approximate planarization and alignment in X, Y and Theta Z have been achieved. As the dock is actuated, alignment and planarization become more precise. With further actuation, alignment and planarization are finalized to a degree of accuracy determined by the alignment features. This is then followed by continued motion in the Z direction, bringing the test head into its final docked position. Further details with regards to specific selected docks are described in the detailed description of the invention, to follow. It is noted that in manipulator driven docking, as described in the previously mentioned U.S. Pat. Nos. 6,057,695, 5,900,737 and 5,600,258, sensors detect the equivalent of a ready to actuate position in order to change from a coarse positioning mode to a fine positioning mode. Thus, to one of ordinary skill in the art, sensing a ready to actuate position in an actuator-driven dock would be a natural extension (intuitive and obvious) of what is taught and disclosed by the '695, '737 and '258 patents.

The invention provides significant improvement to the accuracy and repeatability that is available in contemporary and prior art docks. Accordingly, the details of a typical, exemplary prior art docking system will first be described. This will be followed by a description of an exemplary embodiment of the invention utilized in conjunction with a similar docking system. Additional exemplary embodiments and applications of the invention will also be discussed, and a novel method of docking illustrated by these embodiments will be described. It is to be understood that numerous styles and configurations of docking apparatus are known (many of which having been previously mentioned) and that one of ordinary skill in the art may be expected to be able to readily apply the inventive concepts to such systems. As the discussion proceeds, a number of alternatives will be mentioned, but these are not meant in any way to be limiting to the scope of the invention. The description is done with the aid of the figures which are intended to be illustrative and are not necessarily drawn to scale nor are they intended to serve as engineering drawings.

To begin, selected details of an exemplary prior art dock are illustrated in FIGS. 1A and 1B, FIGS. 2A and 2B, and FIGS. 3A through 3D. This dock was previously mentioned under the Background of the Invention and it will next be described in some detail. This dock and the related description includes aspects from an earlier docking apparatus described in the previously mentioned U.S. Pat. No. 4,589,815, which is incorporated by reference.

Figure 1B:
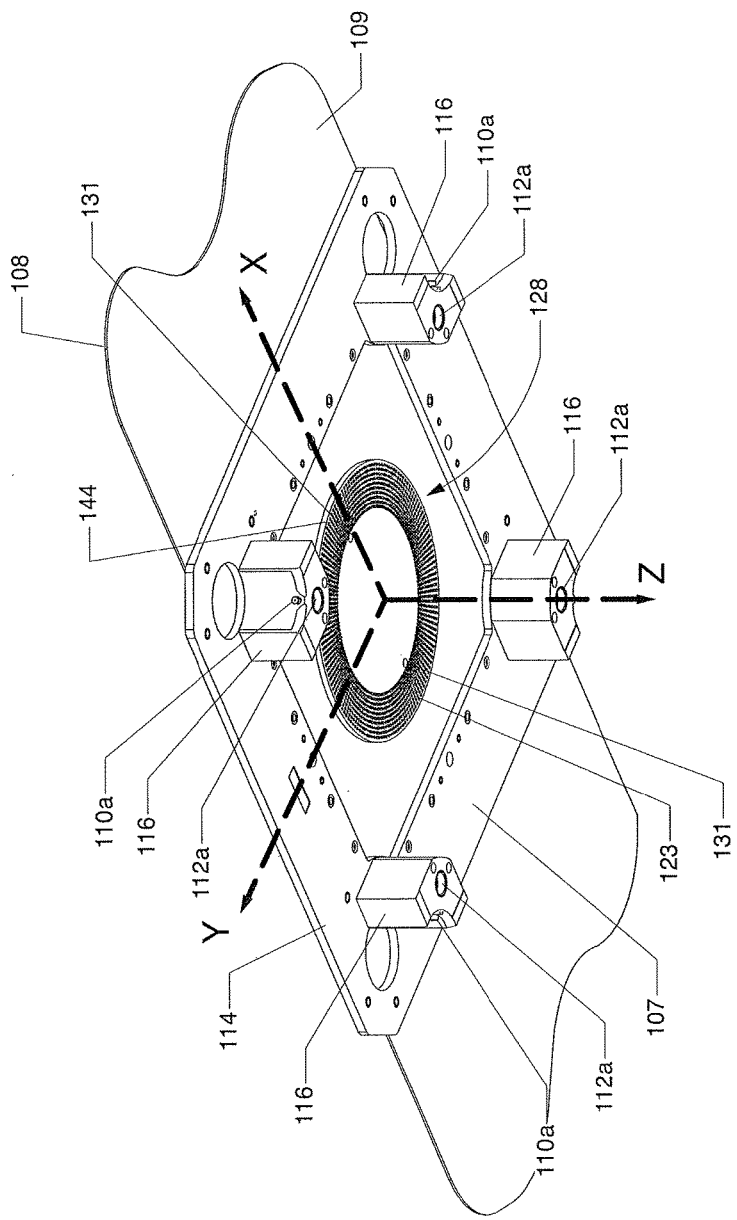
FIG. 1B is an enlarged perspective view of the peripheral shown in FIG. 1A with a coordinate system added for reference.
Figure 2A:
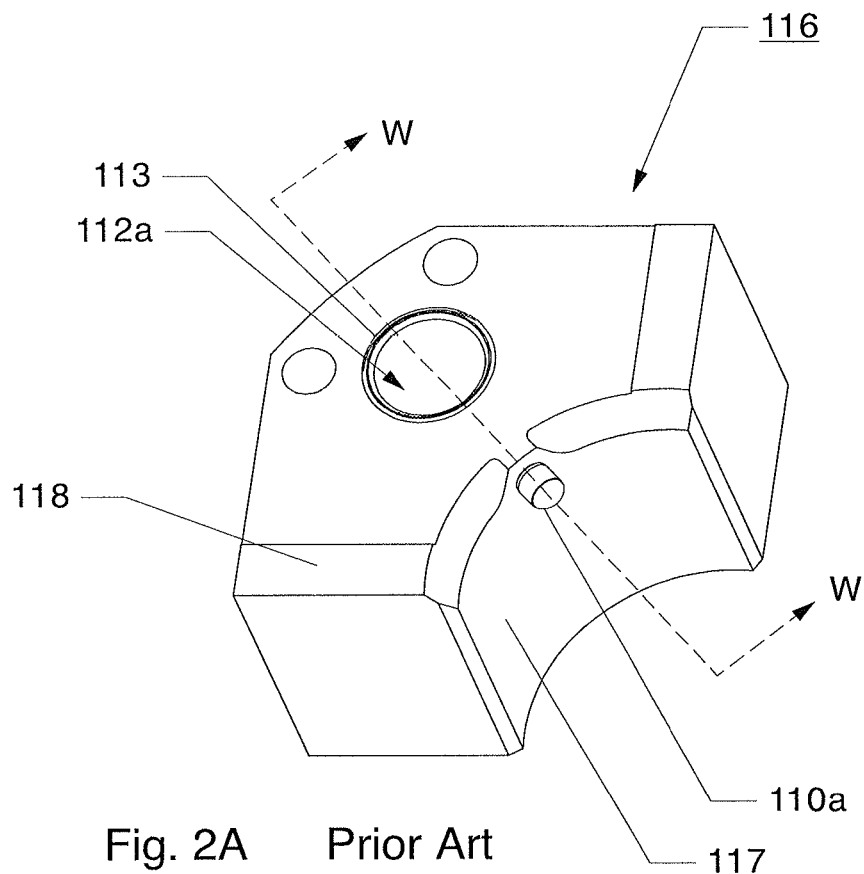
FIG. 2A is a perspective view of a typical gusset.
Figure 2B:
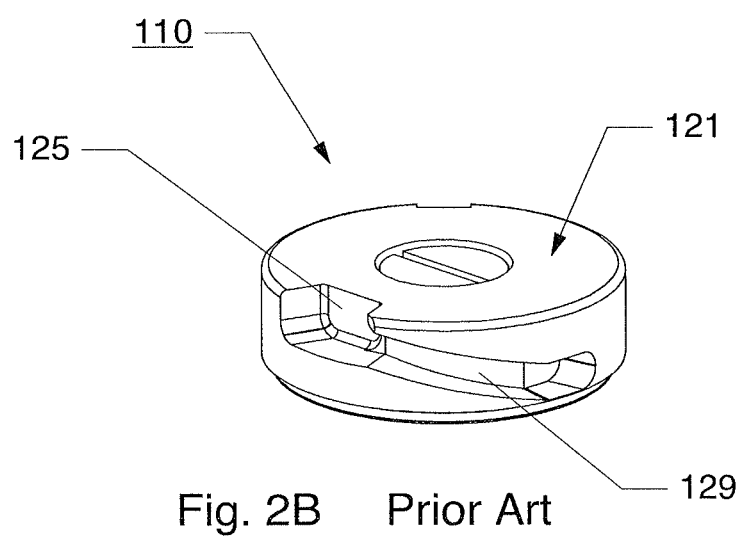
FIG. 2B is a perspective view of a typical circular cam.
Figure 3A:
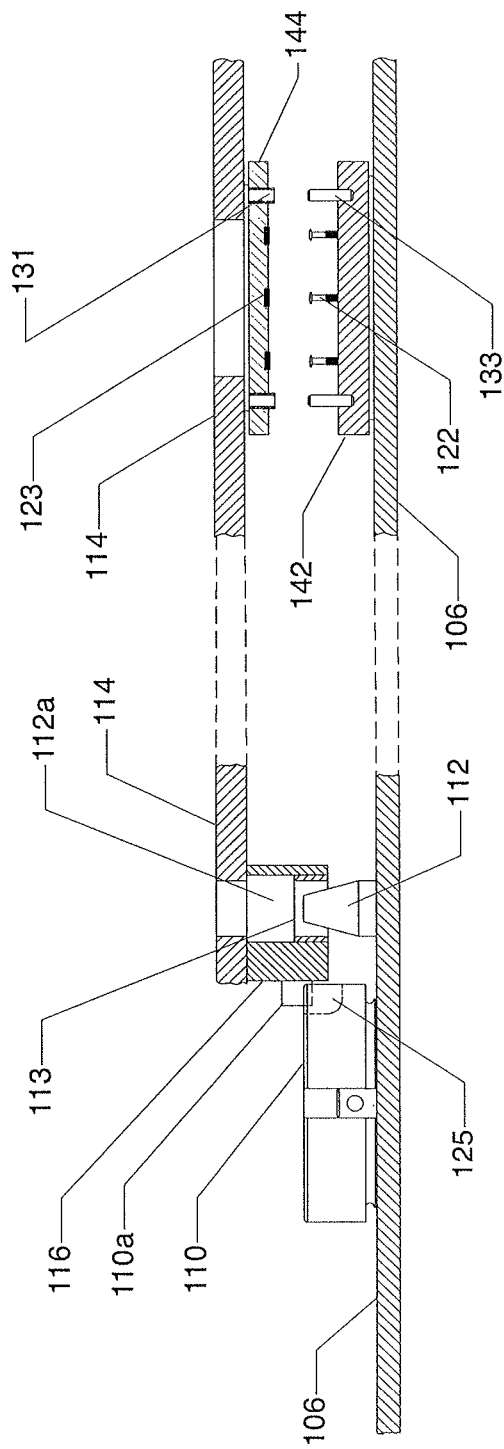
FIGS. 3A, 3B, 3C and 3D are side and partial-cross-section views of a sequence of stages in the docking the test head of FIG. 1A with the peripheral of FIG. 1A.
Figure 3B:
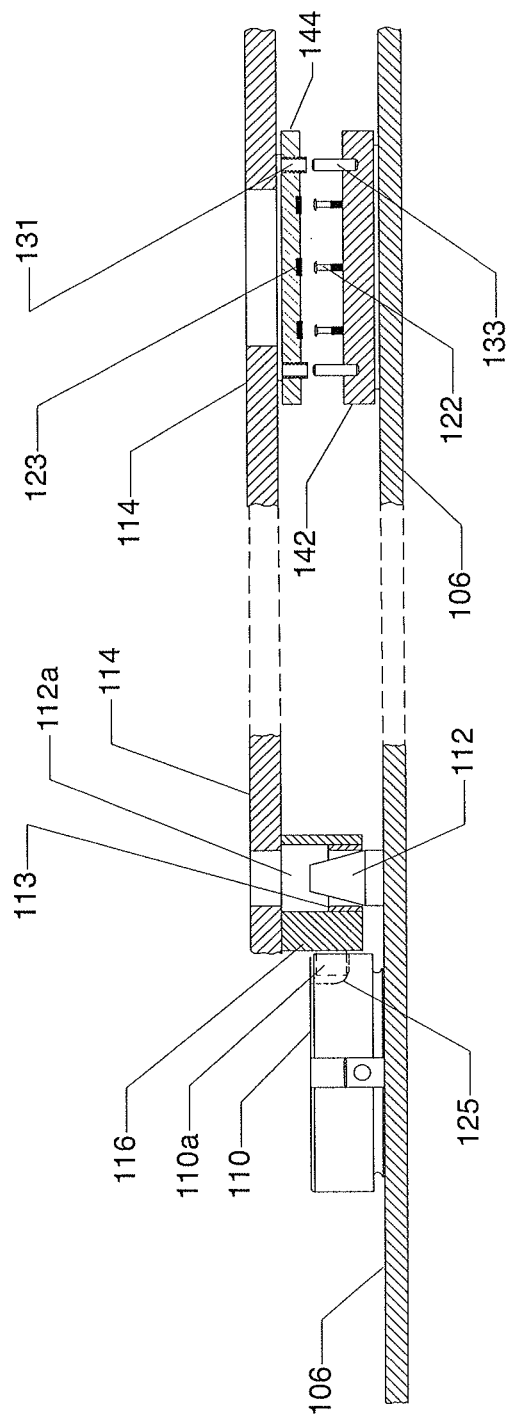
Figure 3C:
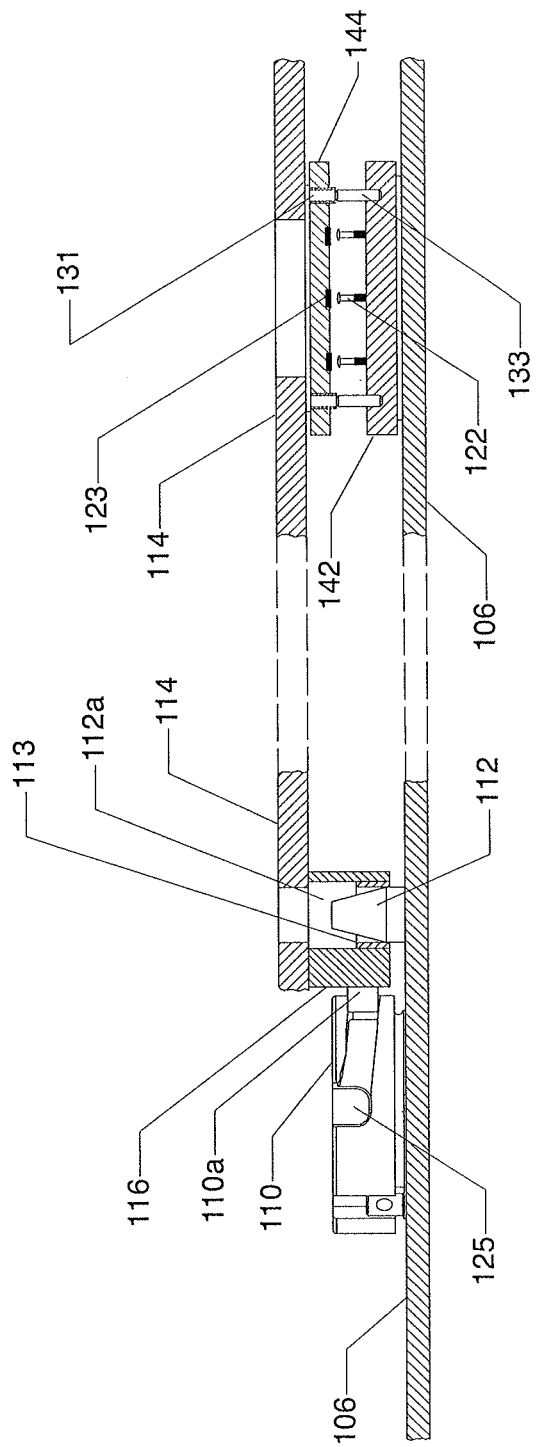
Figure 3D:
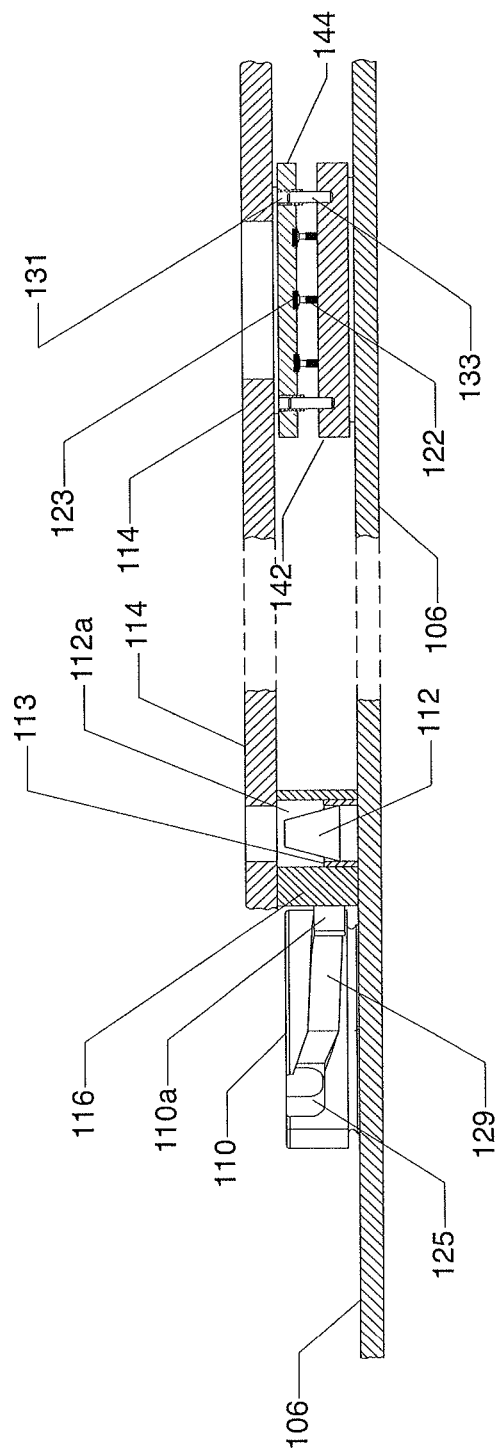

FIG. 1A shows in perspective a test head 100, which is typically held in a cradle (not shown) that is in turn supported by a test head manipulator (not shown). Also shown is a cut-away segment of a handler apparatus 108 to which test head 100 may be docked. DUT adapter 144 is attached to handler apparatus 108; thus the system is a peripheral-mounted-DUT-adapter system. In this particular example the handler apparatus 108 may be a packaged device handler and DUT adapter 144 may be a DUT socket board. The test head 100 is docked to handler apparatus 108 from below with a generally upward motion. Other orientations are possible and known, including, but not limited to: docking to a top surface with a downward motion, to a vertical plane surface with horizontal motion, and to a plane that is at an angle to both the horizontal and vertical. Typically, docking to a top surface is used when the handler apparatus is a wafer prober; while all of the configurations are most typically used with package handlers of varying styles. FIG. 1B shows device handler 108 in somewhat larger scale and greater detail. Handler apparatus 108 includes planar outer surface 109. FIG. 1B includes in broken lines mutually perpendicular axes X, Y and Z, which form a right-handed Cartesian coordinate system. The X and Y axes lie in a plane which is parallel to the outer surface 109 of handler apparatus 108 and also parallel to the plane defined by DUT adapter 144. These planes are parallel to the previously defined peripheral docking plane." The Z-axis represents the perpendicular distance from DUT adapter 144. Rotations about an axis parallel with the Z-axis are referred to as "theta Z" motion.

Referring to FIG. 1A, signal contact ring 142, which includes test-head electrical interface 126, is coupled to test head 100. Electrical interface 126 provides electrical connections to the testing electronics within test head 100. Handler apparatus 108 has coupled to it a corresponding DUT adapter 144, which includes electrical interface 128. In package handlers, DUT adapter 144 often includes one or more test sockets. These test sockets are for holding and making electrical connections to the device or devices under test; and DUT adapter 144 is thus often referred to as a DUT socket board or more simply as a "DUT board" or "socket board." In wafer probers, DUT adapter 144 may be a "probe card" that includes needle like probes for making electrical connections to unpackaged devices included on a wafer. The DUT contacting elements, either probes or sockets, are located on the opposite side of the board from electrical interface 128, which provides electrical connections to either the test socket(s) or probes as the case may be, and are thus not visible in FIGS. 1A and 1B. Electrical interfaces 126 and 128 typically have hundreds or thousands of tiny, fragile electrical contacts (not clearly shown) that must be respectively and precisely joined together (i.e., conjoined) in a manner to provide reliable corresponding individual electrical connections when the test head is finally docked. In a typical, contemporary situation the contacts within test-head electrical interface 126 are tiny spring loaded "pogo" pins 122, and the corresponding contacts on DUT-adapter electrical interface 128 are conductive landing pads 123. (Pogo pins 122 and landing pads 123 are not individually distinguishable in FIGS. 1A and 1B due to the scale.) Various other types of contacting devices may also be included as need be for special signals such as radio frequency and low level analog signals. As is shown in this exemplary case, the lower surface 109 of handler apparatus 108 contains the handler electrical interface 128, and the test head 100 is docked with a generally upward motion from below.

Handler apparatus 108 includes reference features 131, which in this case may be bushing-lined holes disposed at precise locations with respect to its lower surface 109. The inside diameter of the bushing may typically be approximately ¼ inch to ⅜ inch. Reference features 131 are for properly aligning DUT adapter 144 with handler apparatus 108 so that the handling apparatus's positioning mechanism can effectively place DUTs in contact with the test socket(s) or probes. For example, DUT adapter 144 may be designed with corresponding holes so that temporary dowel pins can hold DUT adapter 144 in position while it is fastened to handler apparatus 108 with appropriate fasteners. Once it is fastened, the temporary dowels may be removed, if desired. Furthermore, reference features 131 may be utilized to align signal contact ring 142 with handler apparatus 108 and DUT adapter 144. Thus, corresponding reference pins 133 are mounted on signal ring 142. To facilitate relatively easy insertion, the full diameter of reference pins 133 is typically a few thousandths of an inch less than the inside diameter of the bushings of reference features 131. Also, reference pins 133 are normally tapered at their distal ends. These two properties facilitate their entry into and a sliding fit with respect to the bushings of corresponding reference features 131. Preferably, the apparatus is designed so that when reference pins 133 are fully conjoined with reference features 131, the electrical contacts of electrical interface 126 are aligned with and in full conductive contact with their corresponding respective electrical contacts of interface 128. A primary goal of docking is to maneuver test head 100 into a position that provides such alignment and to maintain that position while testing.

Although a specific configuration of reference features has been described, those familiar with the field will recognize that other arrangements are both possible and in use. For example, the locations of reference pins and receptacles could be reversed with the pins placed on the peripheral side and receptacles incorporated on the test head side. The essential role of the reference features is to aid in the initial set up of the docking apparatus by providing initial alignment to within a few thousandths of an inch between the two halves. Once that has been achieved, their use for alignment in repetitive docking operations may be optional, provided that the docking apparatus has equivalent or superior alignment means. The locations of the reference features may also vary. To illustrate, in certain instances the peripheral-side reference features may be integral to the peripheral as described above with respect to FIGS. 1A and 1B; however, in other instances they may be included on the DUT adapter, which has been previously aligned with the peripheral during its installation. The locations of the reference features on the test head side could similarly vary. The details of the actual reference features are not essential to the invention to be described. Thus, in the embodiments to be described reference numbers 131 and 131' will be used to indicate generic peripheral-side reference features, and reference numbers 133 and 133' will be used to indicate generic test-head-side reference features. It will be further recognized that the features shown are generic in nature, and that other types could be readily substituted without any loss of generality in describing the invention.

Still referring to FIGS. 1A and 1B, a four-point docking apparatus is shown; portions of it are attached either to the handler apparatus 108 or to the test head 100. Attached to test head 100 is faceplate 106. Four guide pins 112 are attached to and located near the four corners of faceplate 106. Face plate 106 has a central opening and is attached to test head 100 so that the test head signal contact ring 142 and electrical interface 126 are accessible. Guide pins 112 define an approximate rectangle that has an approximate common center with electrical interface 126. Faceplate 106 and electrical interface 126 preferably lie in parallel planes.

In the following detailed description of the Figures, directional terms such as up, down, left, right, etc. refer to directions on the page and not necessarily to directions in practice. Those of reasonable skill in the art will appreciate that mechanisms being described operate in any orientation.

Gusset plate 114 is attached to the exterior surface 109 of handler apparatus 108. Gusset plate 114 is mounted so as to be parallel with the peripheral docking plane of handler apparatus 108. Gusset plate 114 has a central opening and is attached to handler apparatus 108 so that DUT adapter 144 and electrical interface 128 are accessible.

Figure 4:
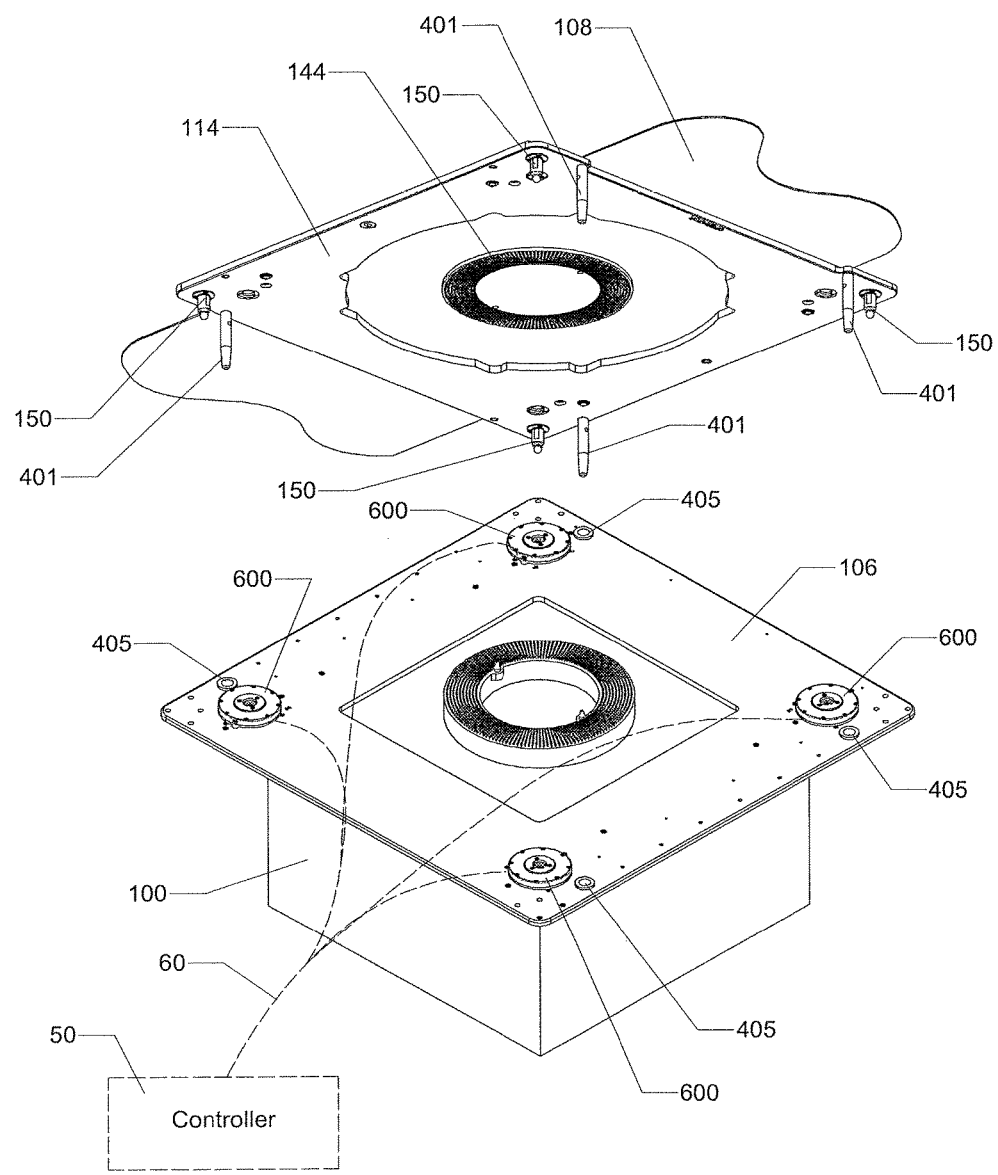
FIG. 4 is a perspective view of a test head an peripheral prior to docking in accordance with an exemplary embodiment of the present invention.

Now referring to FIG. 4, an exemplary embodiment of the present invention is illustrated. Four docking pins 150 are shown extending from gusset plate 114, which is attached to peripheral 108. Each docking pin 150 is positioned so that it is in respective position relative to docking pin receivers 600 which are attached to face plate 106, which is shown attached to test head 100. Although, in an exemplary embodiment of the present invention, receivers 600 are attached to test head 100 and pins 150 are attached to peripheral 108, the relative positions of the two could be readily interchanged without significant changes to design or functionality. Also, coarse alignment pins 401 are mounted on gusset plate 114 in positions corresponding to coarse alignment receptacles 405 included in face plate 106. As shown in phantom a controller 50 may be provided which is in communication (e.g., electrically, wirelessly, photonically, fluidically, etc.) with each pin receiver 600. Finally, as will be further described later in some detail, pin receivers 600 include fluid operated mechanisms that interact with docking pins 150 and move them into and/or out of a docked position.

An overview of the exemplary embodiment of FIG. 4 is now provided. In order to dock test head 100 to peripheral 106, a test head manipulator (not shown) may be used to bring test head 100 into proximity of peripheral 106 and maneuvered so that coarse alignment pins 401 enter receptacles 405. During such maneuvering, it is noted that coarse alignment pins 401 additionally serve to maintain a spacing between gusset plate 114 and face plate 106, thus providing a certain amount of protection to electrical contacts 126 and 144. Test head 100 may then be further maneuvered safely so that docking pins 150 are aligned with and ready to enter their respective receivers 600. As test head 600 is urged still closer to peripheral 106, docking pins 150 enter receivers 600 and are respectively detected by position sensors (not shown) incorporated within each. Also provided is a controller function 50, which communicates over communication links 60 with each docking pin receiver 600. Controller 50 and communication links may take many forms and communications may be over a variety of different media. In an exemplary embodiment the controller may be a Programmable Logic Controller and the communication links may be wires, which carry electrical signals. Sensed pin position information may be communicated to a controller 50. The controller 50, in turn, may signal each receiver 600 to use an internal mechanism to physically grasp its respective pin 150 when it has reached a certain point of insertion. When all pins 150 have been so grasped (and all have been inserted to the same depth, establishing planarity between gusset plate 114 and faceplate 106), the controller 50 signals all receivers to pull their respective pins and thus test head 100 into the final docked position. It is emphasized that each receiver 600 signals the presence and/or position of its respective pin 150 to the controller 50, which in turn signals the receivers 600 to perform appropriate functions. Thus, each pin may be captured individually as it arrives in position. This means that the pins may be captured one at a time rather than all be required to be captured simultaneously. In this way a good deal of precision may be advantageously achieved with parts economically machined to readily available tolerances of a few thousandths of an inch. In the exemplary embodiment of the invention to be further described, the mechanisms incorporated by receivers 600 are actuated by a fluid (e.g. air), which is provided to each receiver 600 at a constant pressure. Valves, controlled by signals from the controller 50, serve to control the fluid so as to perform the desired functions. Final, docked alignment between test head 100 and peripheral 108 is established by the final fit and relative locations of pins 150 within their respective receivers 600.

A more detailed description of an exemplary pin 150 and receiver 600 is now provided.

Figures 5A, 5B:
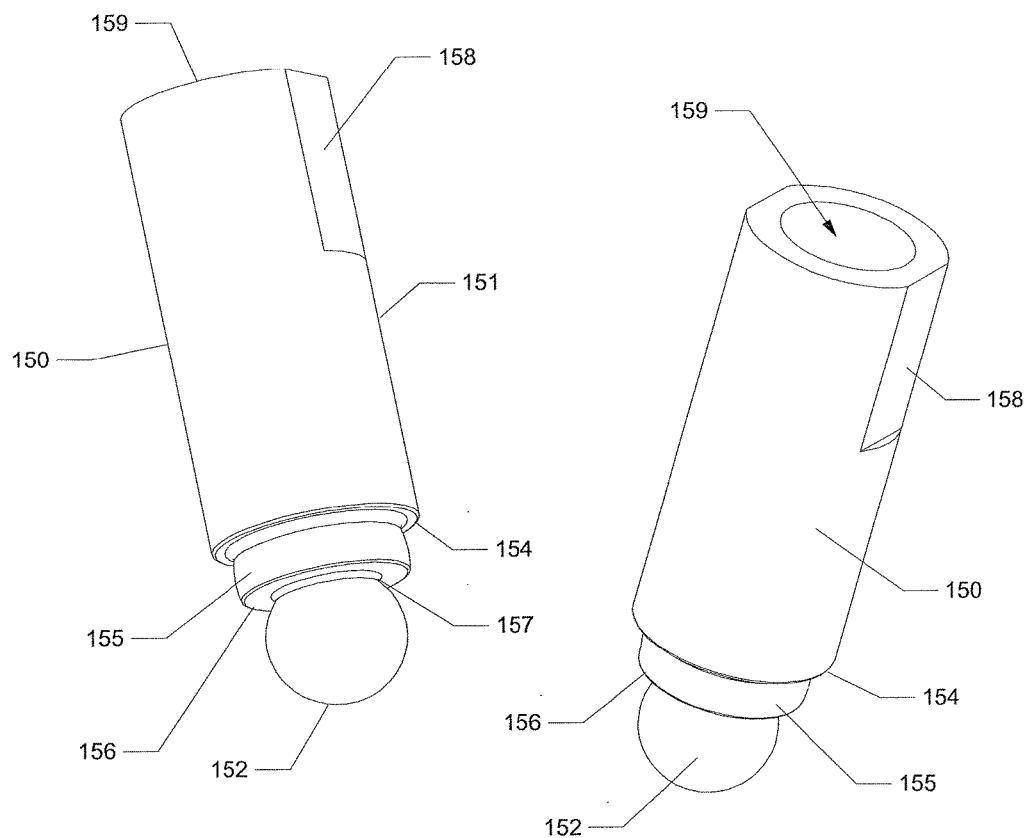
FIGS. 5A and 5B are perspective views of exemplary docking pins in accordance with an exemplary embodiment of the present invention.

Closer perspective views of each docking pin 150 are shown in FIG. 5A and FIG. 5B. Docking pin 150 includes shaft 151. Threaded hole 159 is provided in one end to receive a screw or the like to fasten pin 150 to gusset plate 114. Flat surface 158 is optionally formed in docking pin 150 which may be used to facilitate attachment of docking pin 150 to gusset plate 114. Thus, for example, flat surface 158 facilitates the use of pliers or wrench in order to screw or otherwise secure docking pin 150 to gusset plate 114. First ledge 154 is formed at an end of docking pin 150 opposite to the end that is attached to gusset plate 114. Attached to first ledge 154 is a further section 155 of docking pin 150 with second ledge 156. As shown in FIGS. 5A and 5B, the diameter of second ledge 156 is less than the diameter of first edge 154. Section 155 as will be later elaborated upon, is designed to fit closely within a corresponding alignment region 630 within docking pin opening 625 to (in conjunction with at least one other pin-receiver pair) provide fine alignment of test head 100 within a plane parallel to face plate 106. Section 155 is illustrated as being cylindrically shaped for simplicity; however, as will be recognized by those of ordinary skill, other shapes such as a partial cone or partial spheroid could also be advantageously used. Centered relative to second ledge 156 is ball end 152. Ball end 152 as its name implies, has a ball-like shape. Notch (or indentation) 157 is formed at the junction of second ledge 156 and ball end 152.

Figure 6A:
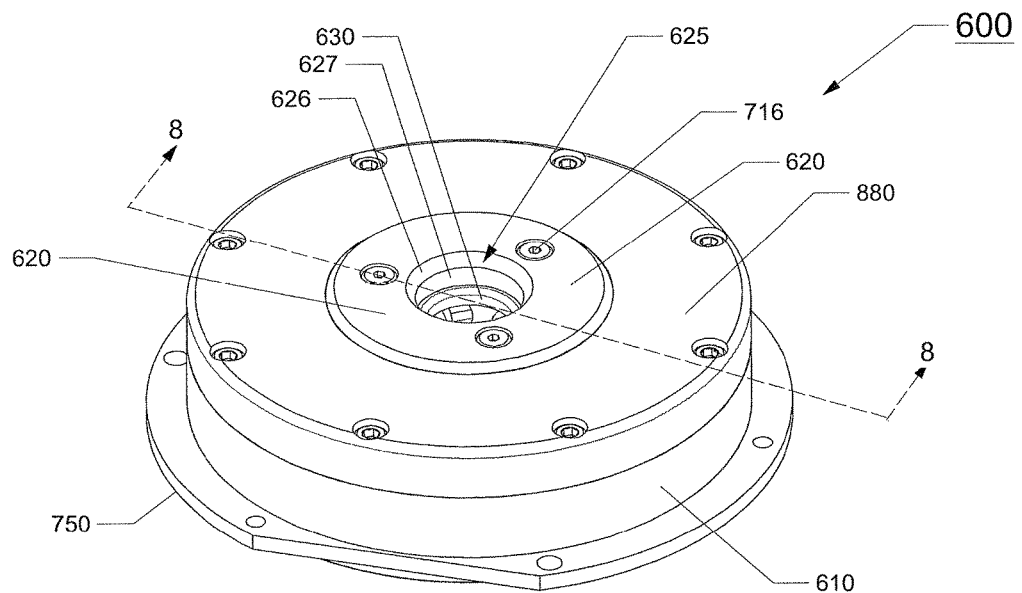
FIG. 6A is a perspective view of a docking pin receiver in accordance with an exemplary embodiment of the present invention.
Figure 6D:
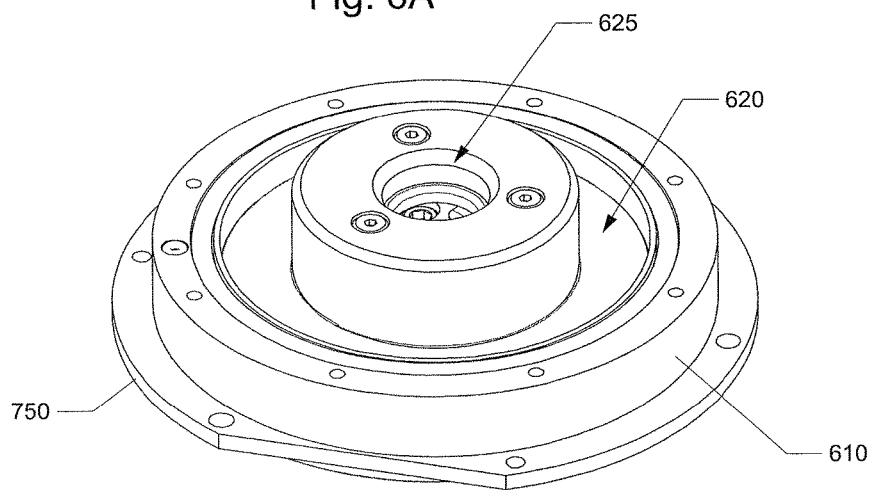
FIG. 6D is a perspective view of the docking pin receiver of FIG. 6A with its cover removed to expose the piston assembled together with the cylinder.
Figure 6B:
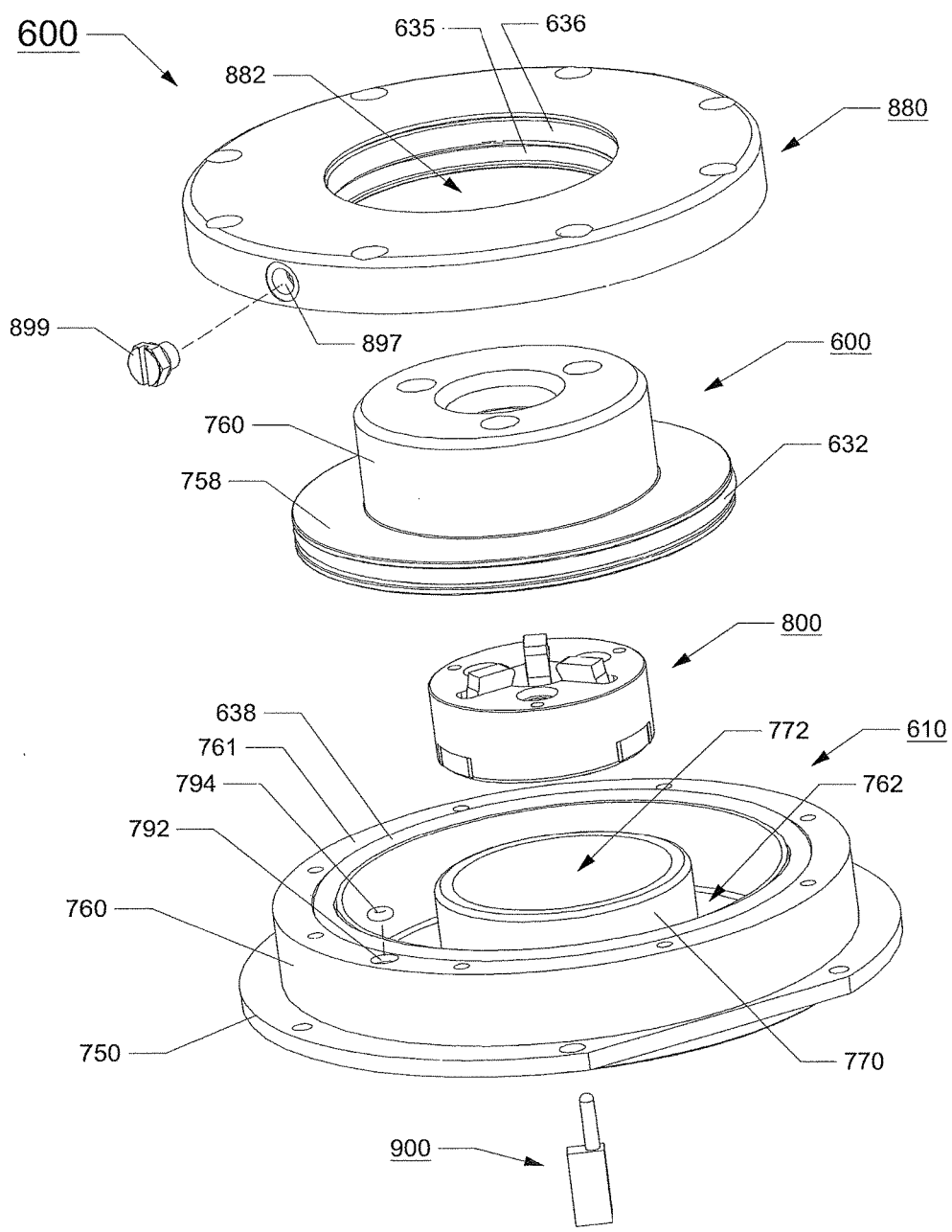
FIG. 6B is an exploded perspective view of the docking pin receiver of FIG. 6A.
Figure 6C:
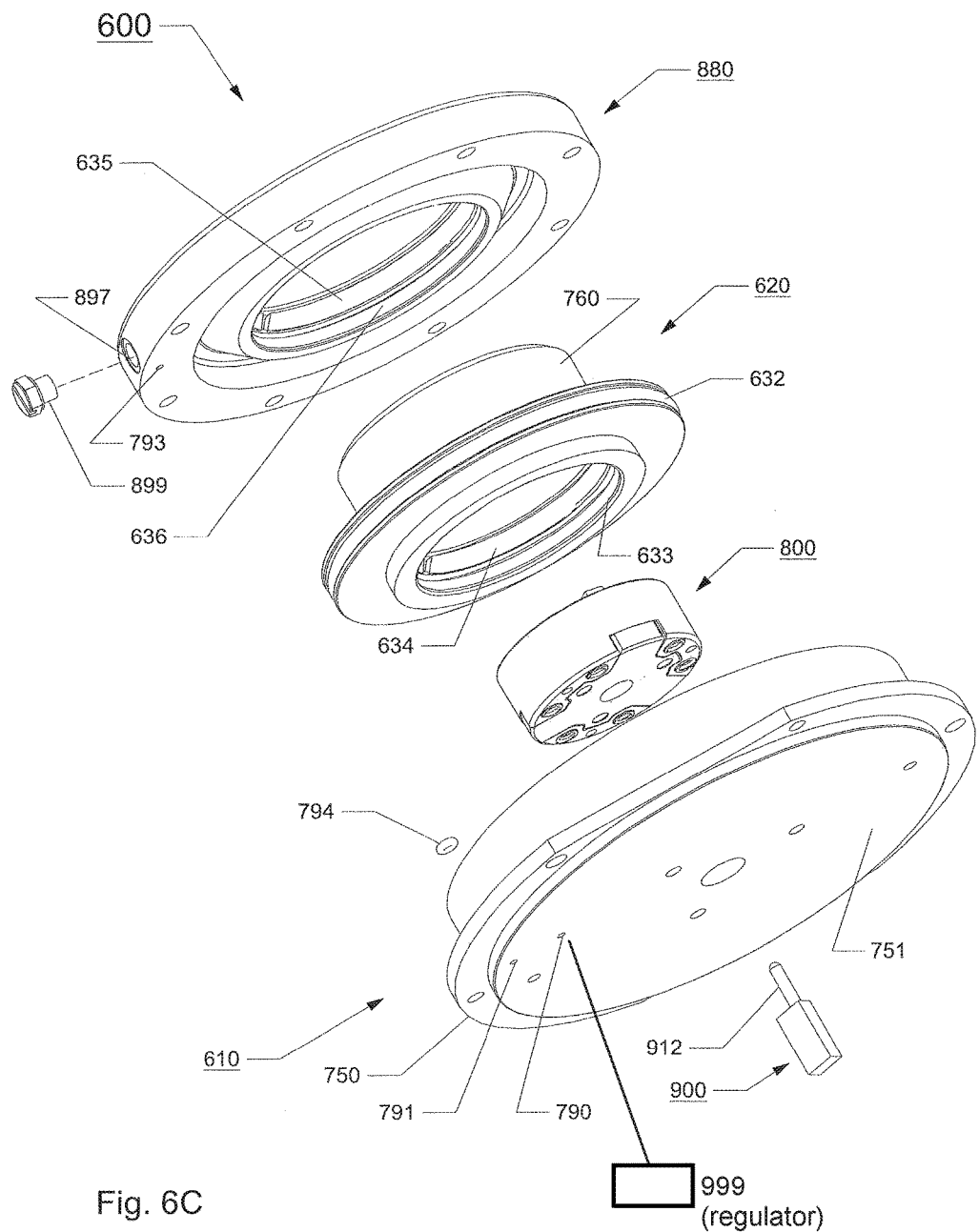
FIG. 6C is another exploded perspective view of the docking pin receiver of FIG. 6A.

Docking pin receiver 600 is illustrated in FIGS. 6A through 6D. FIG. 6A is a perspective view of docking pin receiver 600. FIGS. 6B and 6C provide two partially exploded perspective views to illustrate relationships between various components of docking pin receiver 600. FIG. 6D is a perspective view with cover 880 removed. The cover 880 is not shown in FIG. 6D, FIG. 7A and FIG. 7B for clarity. Docking pin receiver 600, shown in FIGS. 6A-6D includes five components, namely cylinder 610, piston 620, latch unit 800, cover 880, and position sensor 900. Note that certain items such as selected springs and fasteners have been omitted from FIGS. 6B and 6C for clarity purposes.

As can be seen in FIGS. 6B and 6C, cylinder 610 includes base portion 750, outer ring 760, outer cavity 762, inner ring 770 and inner cavity 772. Two fluid ports 790 and 791 for transferring control fluids into and out of receiver 600 are provided on bottom portion 751 of base 750 (FIG. 6C). Port 790 connects to a through passage allowing fluid to flow into and out of the bottom of outer cavity 762. Port 791 connects to a passage that passes through outer ring 760 to emerge at hole 792 in upper surface 761.

Latch unit 800, which will be subsequently described in more detail, slidingly fits within and is axially moveable within inner cavity 772.

Piston 620 is designed to fit in outer cavity 762. Piston 620 includes projection (or flange) 758 whose outer periphery is grooved to receive O-ring 632. The inner circumference of piston 620 includes two grooves sized respectively to receive O-ring 633 and wear ring 634. When piston 620 and latch assembly 800 are assembled with cylinder 610, O-ring 632 bears against the inner wall of outer ring 760, and O-ring 633 and wear ring 634 ride against the outer wall of inner ring 770. Thus, piston 620 is axially movable within cavity 762 and an essentially fluid-tight chamber 764 (FIG. 8) is formed below piston 620. Fluid port 790 enables fluid to be either inserted into or vented from chamber 764.

Inner portion 760 of piston 620 fits within opening 882 of cover 880. The circumference of inner opening 882 is grooved to receive wear ring 636 and O-ring 635, which both bear against inner portion 760 of piston 620, thus forming an essentially fluid-tight seal while allowing piston 620 to move axially with respect to cover 880. Cover 880 is secured in a fluid tight manner with appropriate screws to cylinder 610. O-ring 638 is received by a groove in the upper surface of outer ring 760 to help ensure fluid tightness. Thus, an essentially fluid-tight chamber 766 (FIG. 8), bounded by cover 880 and outer ring 770, is formed above piston 620. Cover 880 also includes radial hole 897, which provides a passage between its outer circumference and inner opening 882. The outer portion of hole 897 is tapped to receive screw 899, which serves to provide a seal against fluid leakage. Fluid passage 793 bored in the bottom of cover 880 (FIG. 6C) intersects hole 897 and aligns with hole 792 in cylinder 610 when cover 880 is assembled thereto. Small O-ring 794 is included to provide a fluid-tight connection between the two. Thus a fluid passage is provided from port 792 to fluid chamber 766.

Docking pin opening 625 is formed within piston 620. In the illustration shown in FIG. 6D, cylinder 610 and piston 620 have been placed together.

In an exemplary embodiment a linear position sensing potentiometer is used as the position sensor 900. Plunger 912 operates a slider on a resistive element contained within body 910 to provide a signal representing the displacement of plunger 912. A spring within body 910 urges plunger 912 outwards. Position sensor 900 is mounted so that plunger 912 extends upwards into the center of inner cavity 772 of cylinder 610. Thus, when docking pin 150 is inserted into opening 625 sufficiently far it will push against plunger 912, signaling its location.

Figure 7A:
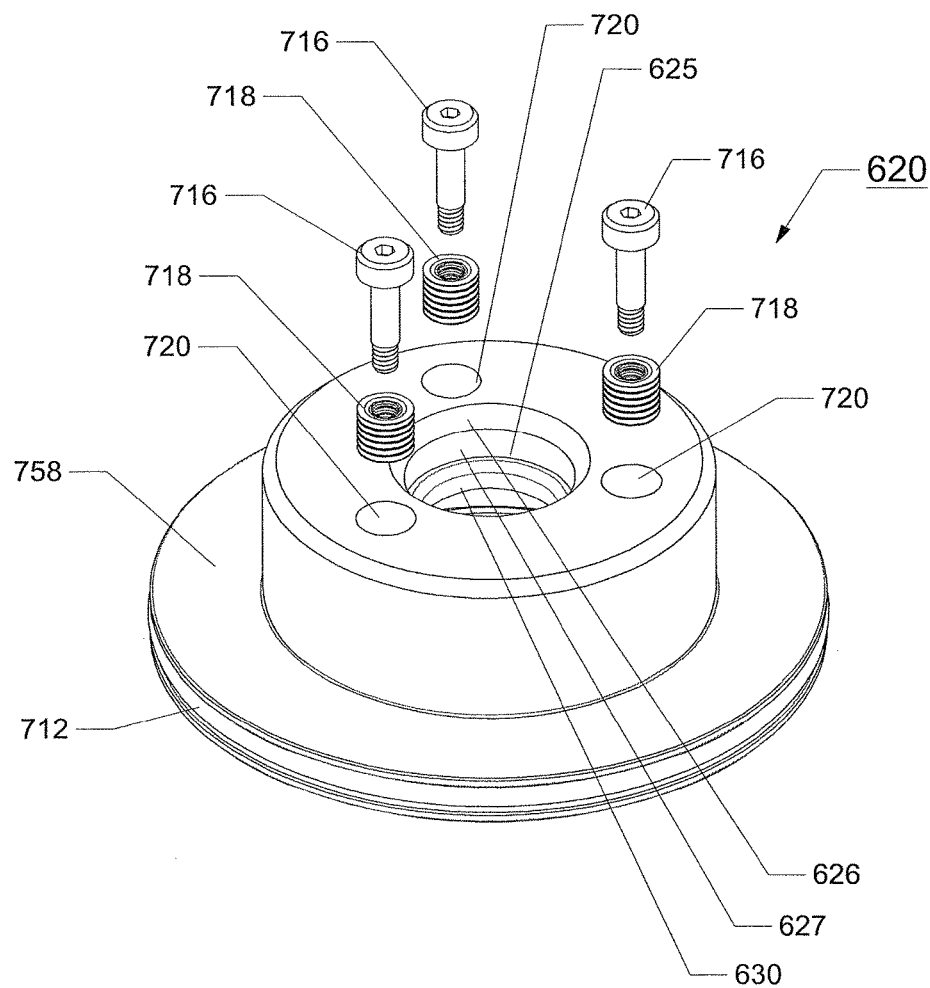
FIG. 7A is an exploded perspective view of the piston shown in FIG. 6D.

FIG. 7A illustrates piston 620 prior to piston 620 being assembled with cylinder 610. As shown here (and also in cross sectional view of assembled receiver 600 in FIG. 8) docking pin opening 625 includes three regions: tapered, entry region 626 to facilitate the first entry of docking pin 150; cylindrical region 627 having a diameter larger than the diameter of docking pin segment 155 to provide a loose fit between the two; and alignment region 630 to provide final, fine alignment. Piston 620 further includes piston projection (or flange) 758, which is a circular and typically flat member. Groove 712 is formed along the edge of piston projection 758 to contain O-ring 632 (see FIG. 8). Springs 718 are inserted into openings 720. Shoulder screws 716 are also inserted into screw openings 720. Shoulder screws 716 extend through springs 718 and engage threaded holes 841 in latch assembly 800 (see FIG. 7B) as will be explained below.

Figure 7B:
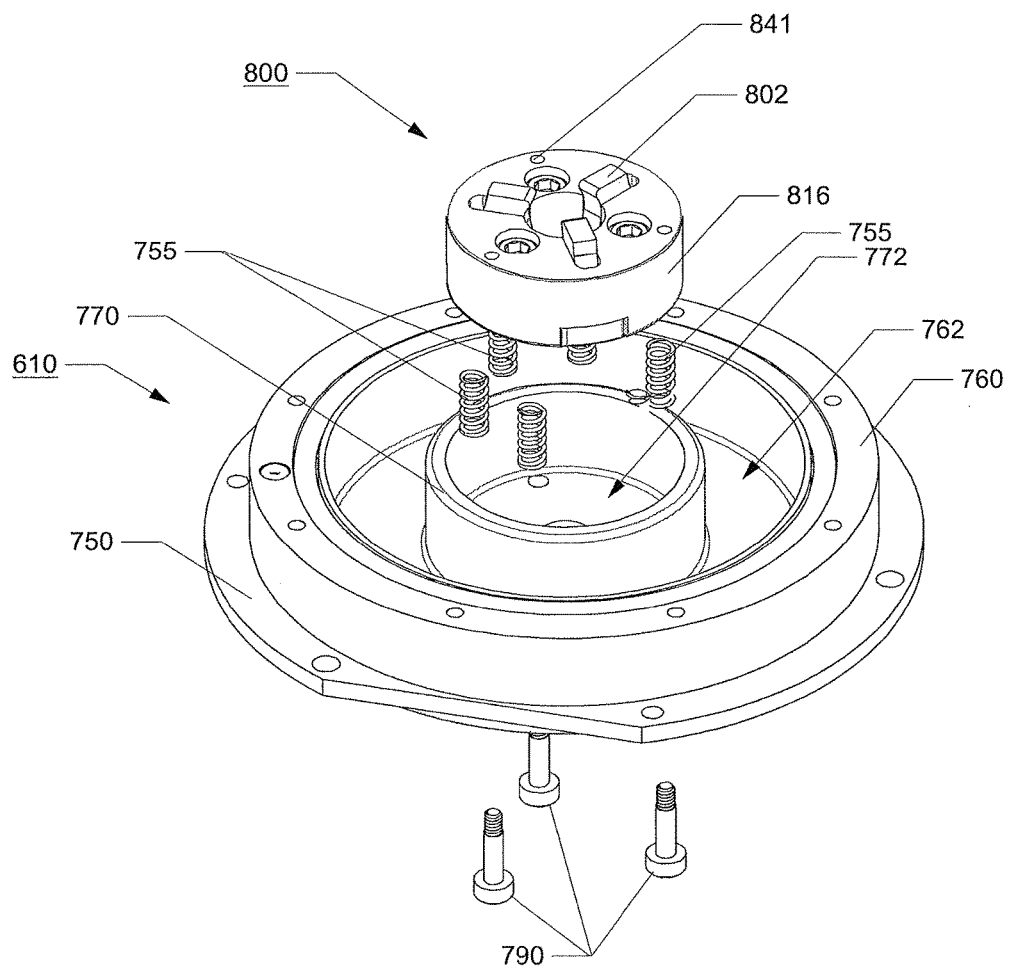
FIG. 7B is an exploded perspective view of the latch unit assembled together with the cylinder shown in FIG. 6D.

An exploded perspective view of cylinder 610 assembled with latch assembly 800 is illustrated in FIG. 7B. Cylinder 610 includes cylinder base 750. Cylinder base 750 may be, for example, round. Attached to cylinder base 750 is outer ring 760. Located within outer ring 760 may be found inner ring 770. Thus, outer cavity 762 is a space which extends from the outer wall of inner ring 770 to the inner wall of outer ring 760. Inner ring 770 includes inner cavity 772. Inserted into inner cavity 772 is latch assembly 800. A plurality of springs 755 reside under latch assembly latch 800 and will be further described below.

Figure 7C:
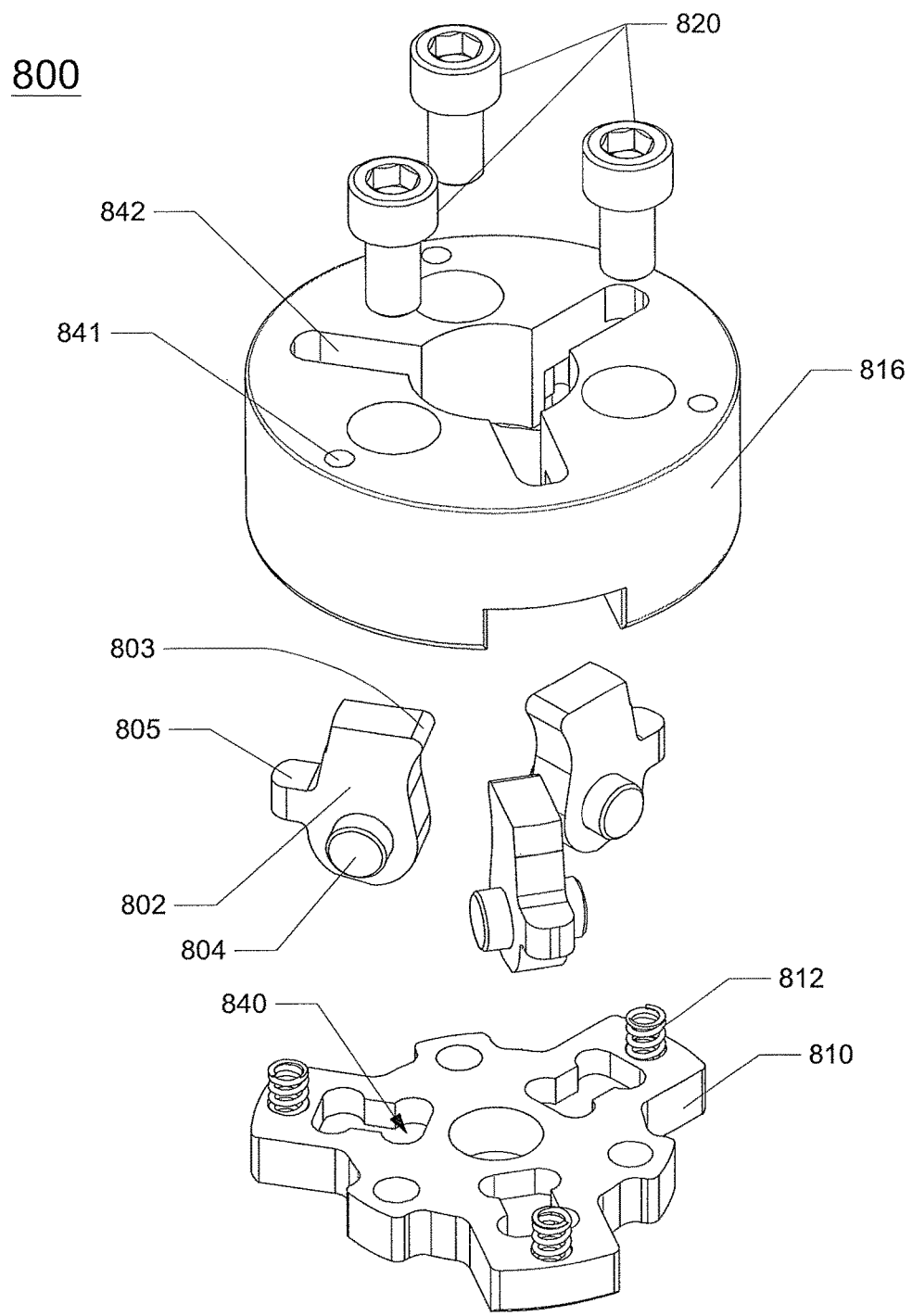
FIG. 7C is an exploded view of a latch unit which appears in FIG. 7B.

FIG. 7C is an exploded perspective view of latch assembly 800. Latch assembly 800 includes retainer 810. A plurality of springs 812 reside on a top surface of retainer 810. Catches 802 are each inserted in a respective opening 840 within retainer 810. Each catch 802 includes pivot shaft 804 and projection 803 which, when inserted into respective catch opening 840, extends towards the center of retainer 810. Pivot shaft 804 allows catch 802 to rotate towards and away from the center of retainer 810. Each catch 801 pivots about an axis extending through pivot shaft 804. Each catch 802 includes rear tab 805. Each rear tab 805 is in contact with the top of each respective spring 812. Thus, each spring 812 presses against the bottom surface of rear tab 805 thus urging projection 803 towards the center of retainer 810. Housing 816 is attached to retainer 810 by screws 820. Thus, each catch 802 is retained within respective cavities 842 formed by housing 816 and retainer 810. Thus, when housing 816 is attached to retainer 810, catches 802 can be observed extending beyond the top surface of housing 816.

Projections 803 are shaped so as to engage with notch 157 in docking pin 150. Thus, when docking pin 150 is inserted into opening 625 sufficiently far it is possible for catches 102 to grasp pin 150 in a positive "claw-like" fashion so that it may be drawn into a docked position.

Figure 7D:
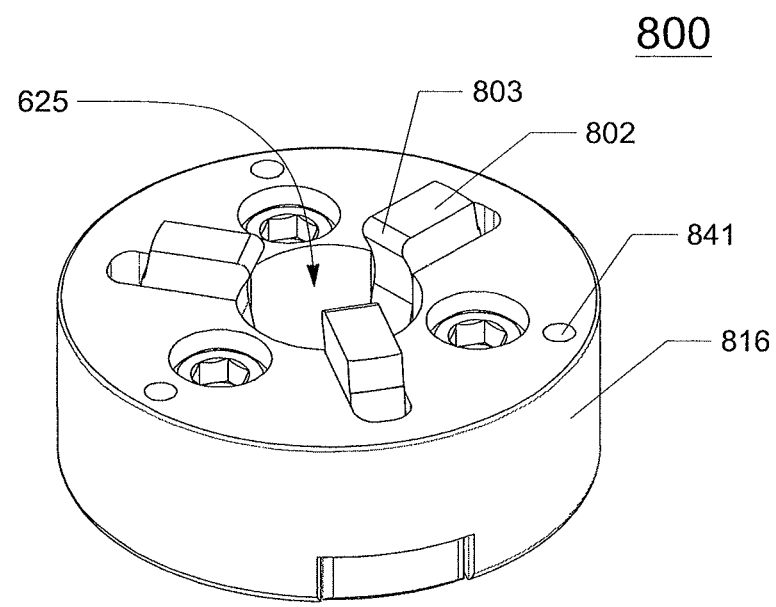
FIG. 7D is a perspective view of an assembled latch unit which is illustrated in exploded form in FIG. 7C.

FIG. 7D is a perspective view of assembled latch unit 800. As shown in FIG. 7D, each catch 802 extends above the top surface of housing 816 and pivots towards and away from docking pin opening 625.

Figure 7E:
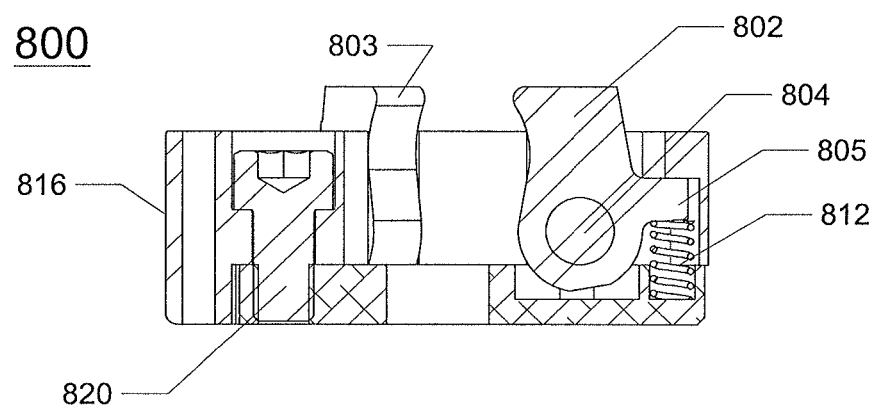
FIG. 7E is a cross sectional view of the latch unit shown in FIG. 7D.

FIG. 7E is a cross sectional view which shows latch unit 800 in an assembled state. Looking at FIG. 7E, rear tab 805 is shown in contact with springs 812. Again, each catch 802 pivots towards and away from opening 625.

Figure 8:
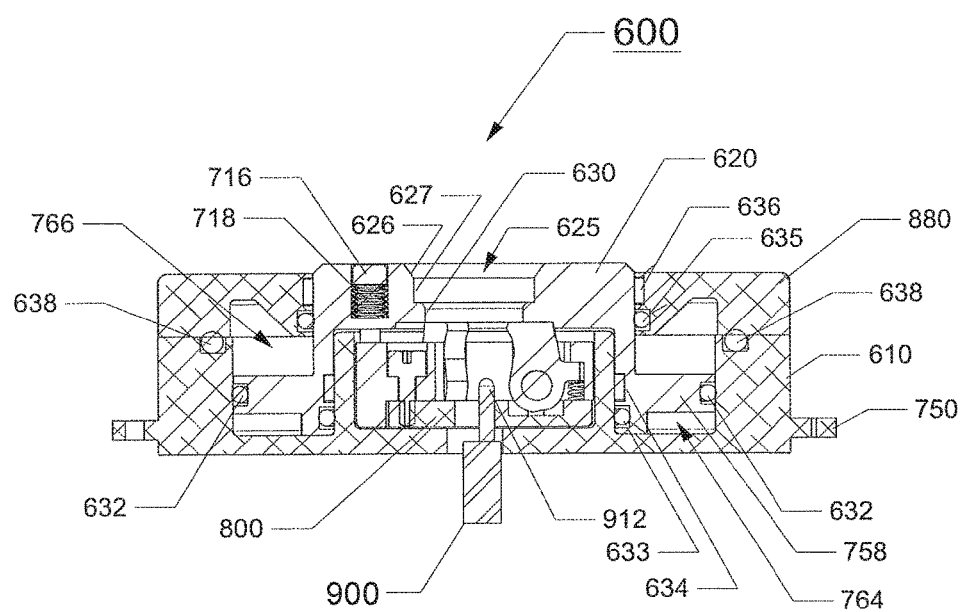
FIG. 8 is a perspective view of the assembled docking pin receiver shown in FIG. 6A.

FIG. 8 is a cross section view which shows docking pin receiver 600 in an assembled state. Piston 620 has been inserted into cylinder 610 and cap 880 has been attached to cylinder 610. Piston 620 is shown slightly protruding through an opening in cap 880. Position sensor 900 is shown with its plunger 912 inserted into inner cavity 772 and thus into the central region of latch unit 800.

Figure 9A:
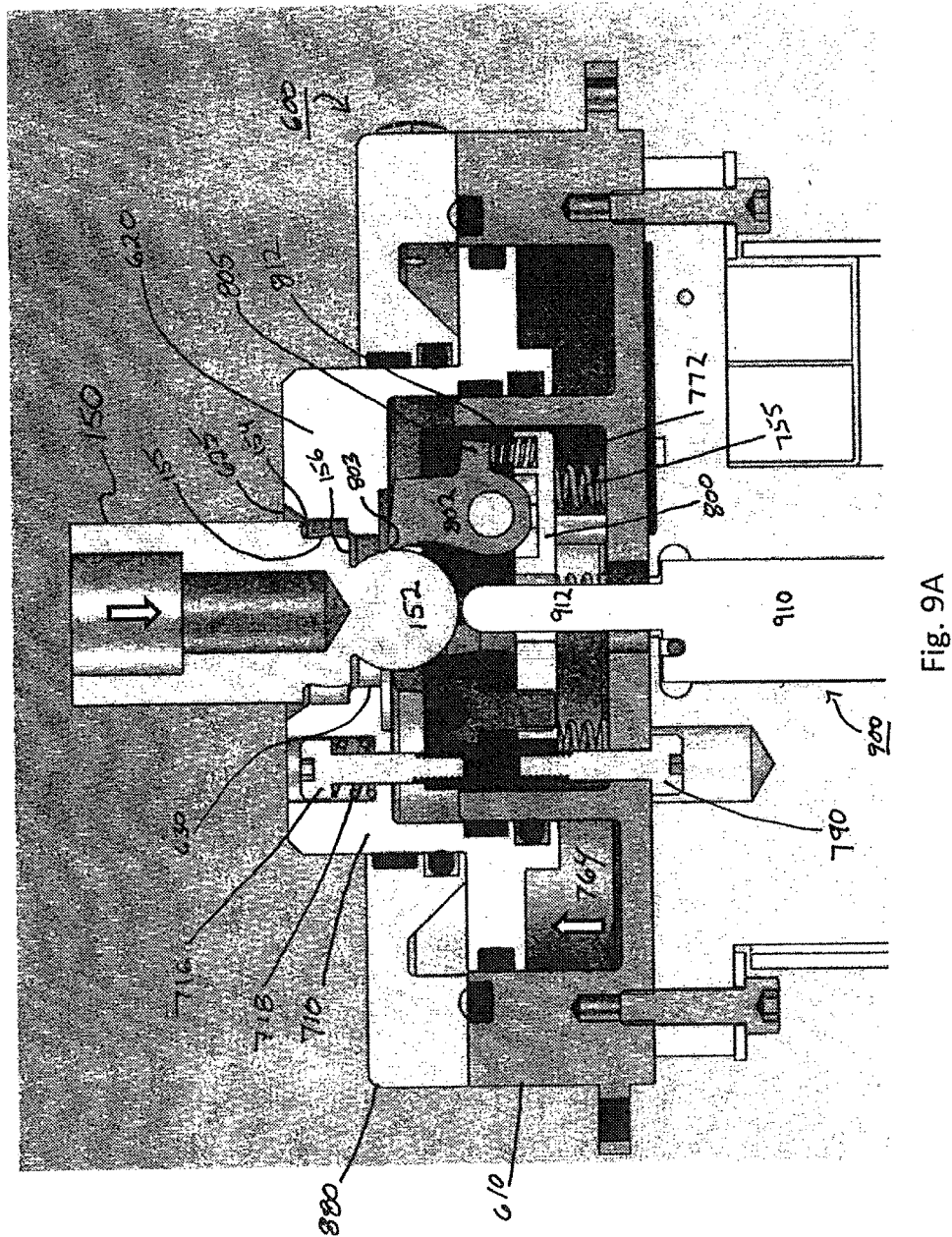
FIG. 9A is a cross sectional view of an exemplary embodiment of the present invention shortly after the docking pin has been inserted into the opening of the piston shown in FIG. 7A.
Figure 9C:
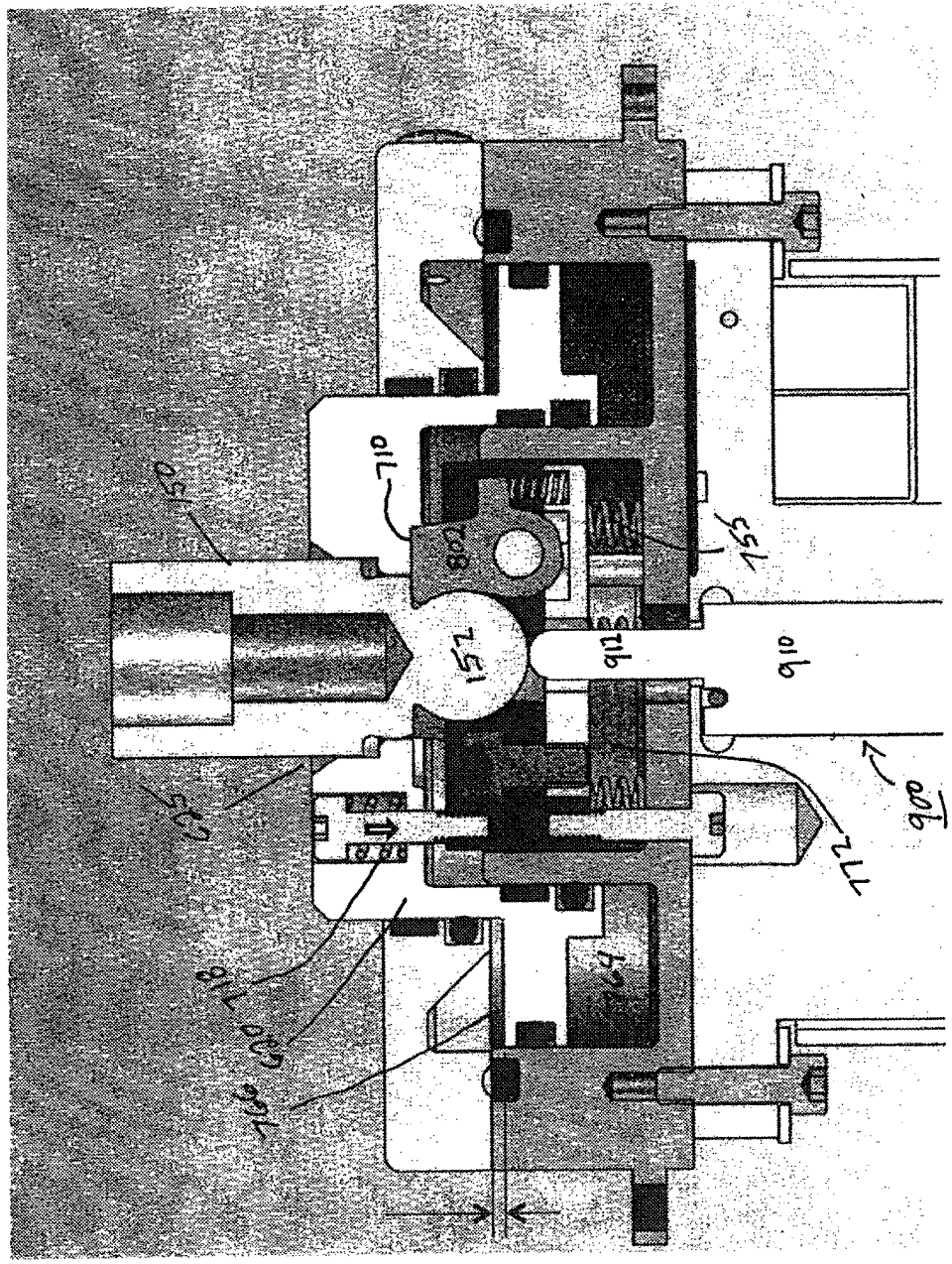
FIG. 9C is a cross sectional view which illustrates an exemplary embodiment of the present invention after the latch has engaged the ball opening of the docking pin, the outer cavity of the cylinder has been partially evacuated of fluid, and the piston has partially descended into the cylinder.
Figure 9D:
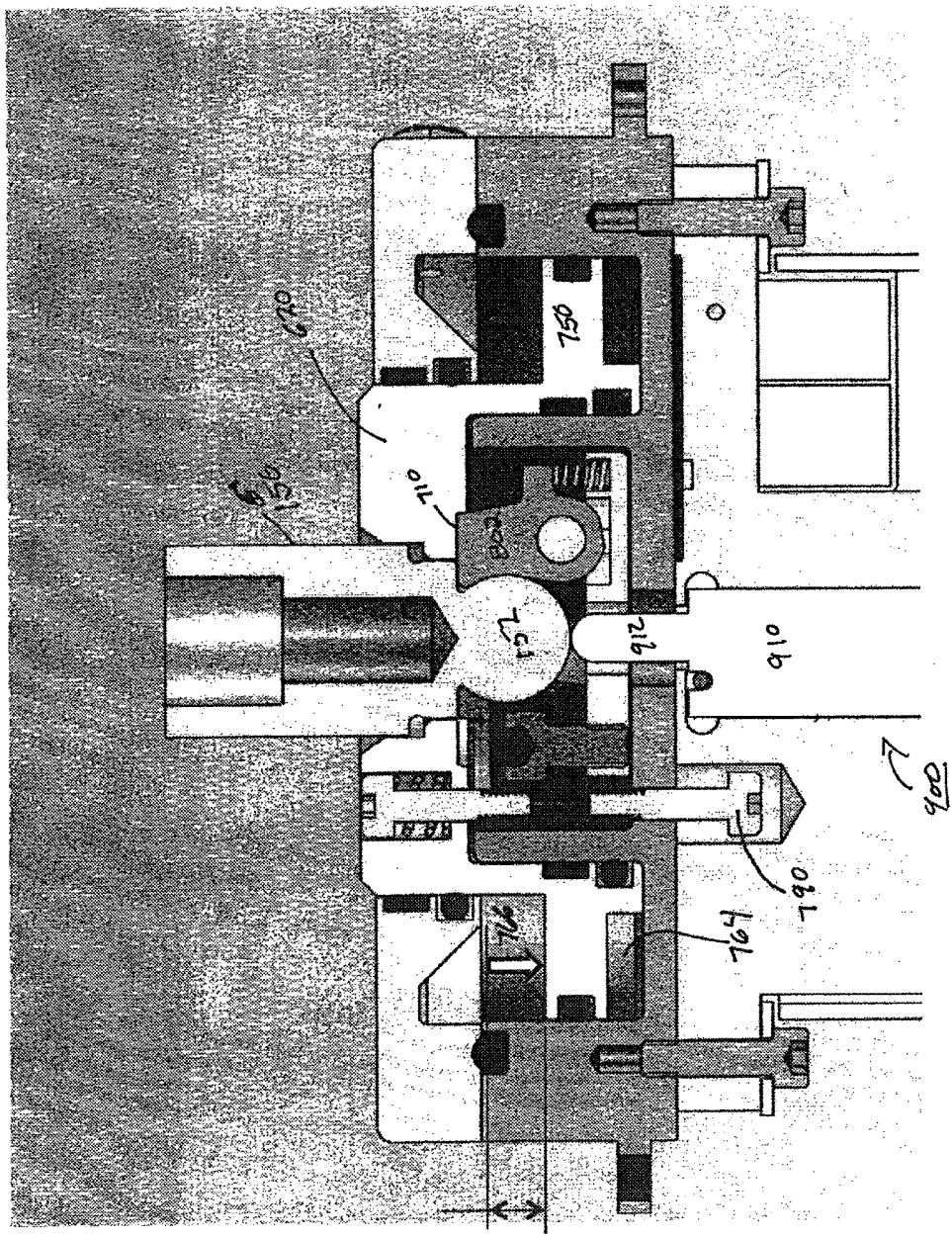
FIG. 9D is a cross sectional view which shows the outer cavity more fully evacuated of fluid and the piston more fully descending into the cylinder.
Figure 9E:
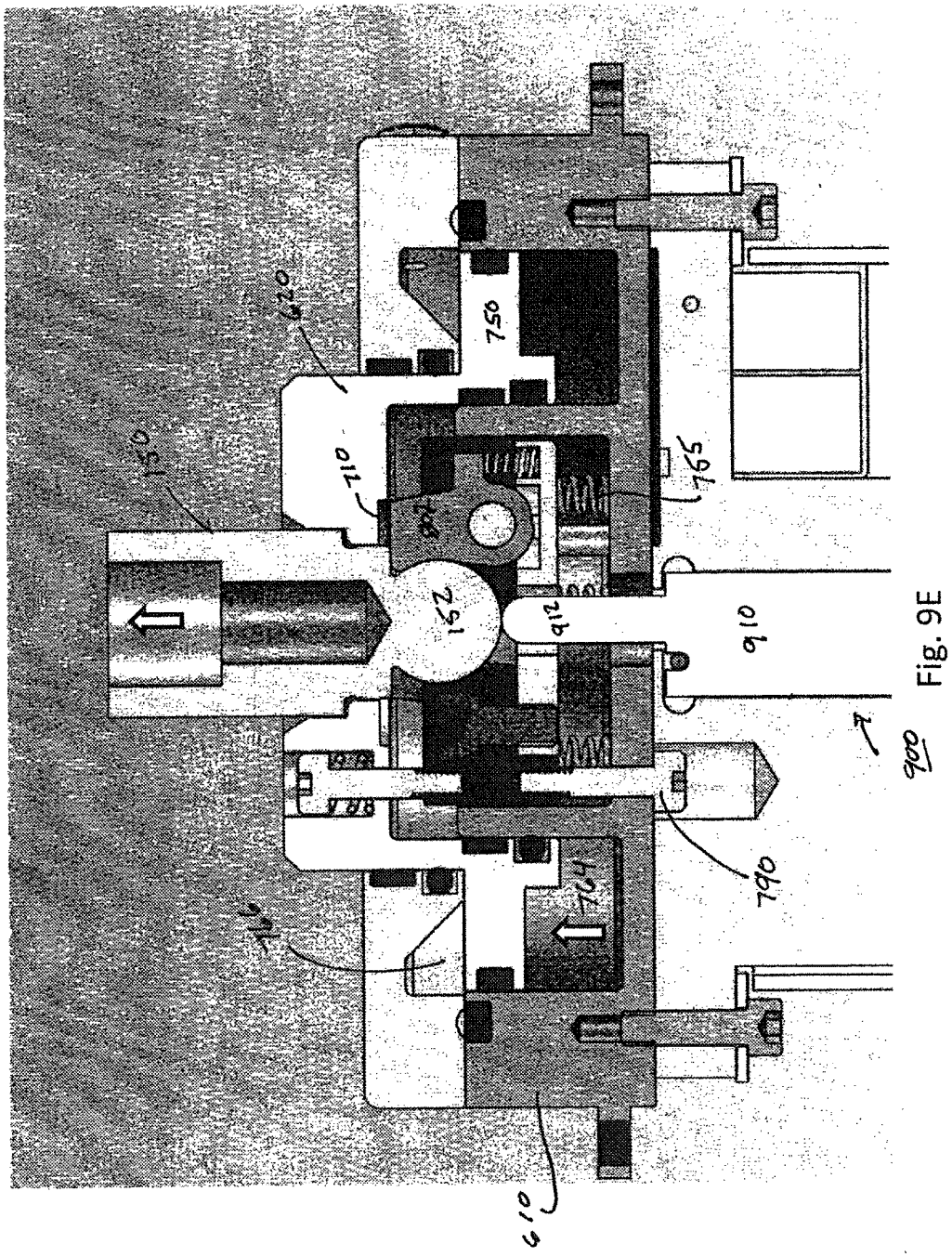
FIG. 9E is a cross sectional view which illustrates an exemplary embodiment of the present invention after the test head has started to undock from the peripheral.
Figure 10:
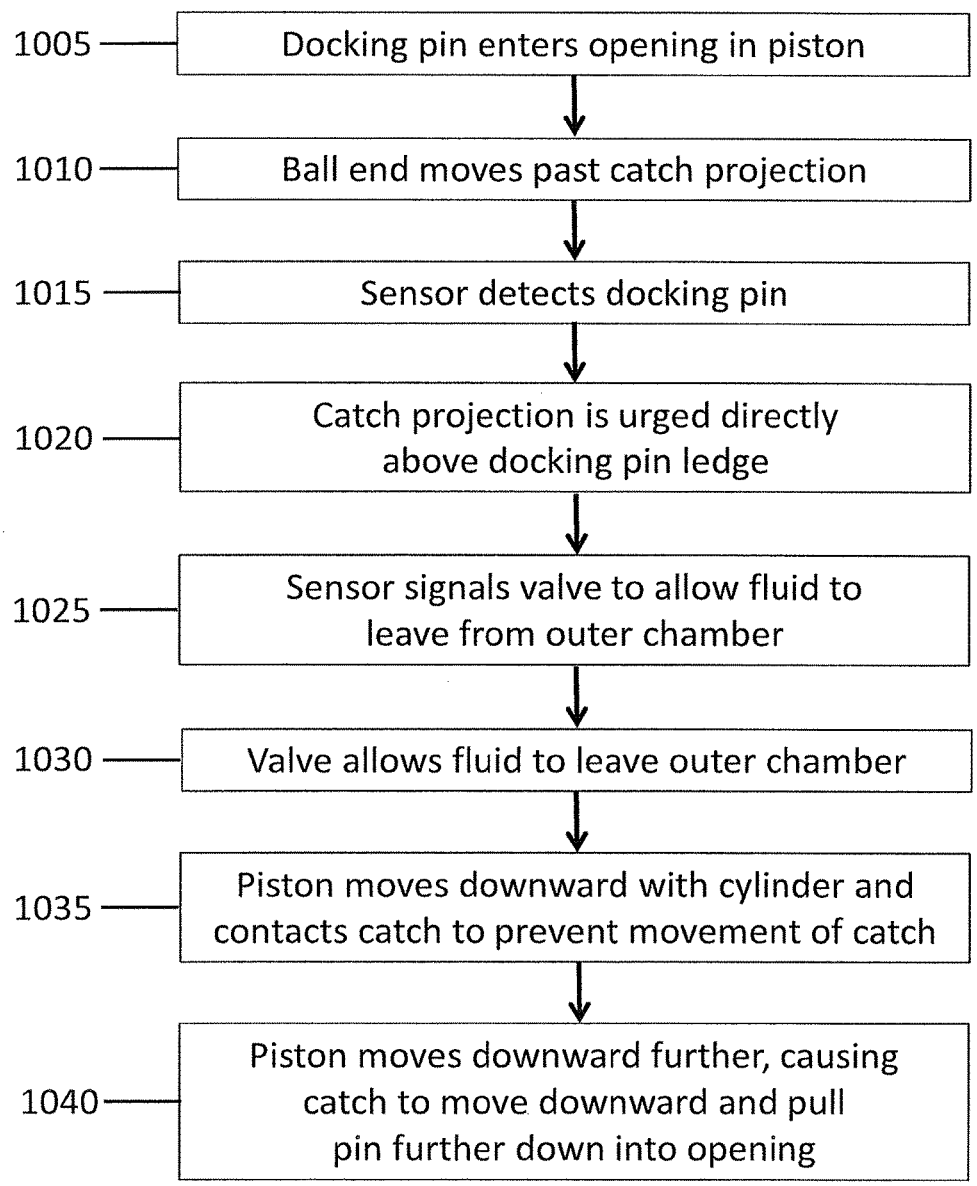
FIG. 10 is a flow chart diagram which illustrates the steps which are illustrated by the cross sectional views of FIGS. 9A-9E.

With reference to FIGS. 9A-9E and FIG. 10, an explanation will now be made of how a test head is docked to a peripheral in accordance with an exemplary embodiment of the present invention. In particular, FIGS. 9A-9E are cross sectional views of an exemplary embodiment of the present invention. In particular they are cross sectional views of a docking pin receiver 600 and its associated docking pin 150. It is to be noted that the section is taken through the centers of the receiver 600 and pin 150, and it is oriented parallel to one of the catches 802 located within receiver 600. Consequently, the other catches and their associated hardware are not visible in these views; however, this is sufficient to explain the operation as all of the catches operate in a similar manner. FIG. 10 is a flow chart diagram which summarizes exemplary steps involved in order to achieve docking between a test head and a peripheral.

As indicated by FIG. 10, step 1005, docking pin 150 enters docking pin opening 625.

As shown in FIG. 9A, ball end 152 of docking pin 150 has entered docking pin opening 625. Ball end 152 is in contact with projection 803 of catch 802 and catch 802 is rotated slightly clockwise (i.e., outward with projection 803 away from the center line of pin 150). Rear tab 805 is pressed against spring 812 so that spring 812 is in a compressed state. Thus, spring 812 is urging catch 802 counter-clockwise (or inward towards the center line of pin 150). As previously noted, only one of a number of catches is shown in this series of sectional figures; however, all catches may operate substantially in unison. Ball end 152 has approached the tip of plunger 912 of sensor 900. Sensor 900, however, has not yet indicated that docking pin 150 has been inserted past a predetermined depth within docking pin opening 625. In an exemplary embodiment of the present invention, sensor 900 is a potentiometer as previously described. Thus, for example, potentiometer 900 is in an uncompressed state as shown in FIG. 9A.

In FIG. 9A piston 620 is shown in a fully elevated state; i.e., it has not yet descended so as to be in contact with catch 802. While piston 620 is not yet descended, catch 802 is free to rotate towards and away from ball end 152. As will be shown in FIG. 9C, piston 620 will eventually descend and abut with the top of catch 802 in order to prevent catch 802 from rotating.

Piston 620 is maintained in an elevated position relative to catch 802 by virtue of fluid (e.g. air) which is located under pressure in fluid chamber 764. Thus, piston base 710 is restrained from descending within chamber 764 unless fluid within chamber 764 is removed, for example, by venting chamber 764. Latch assembly 800, which is movable up-and-down independently within inner cavity 772 and piston 620, is also in an elevated state by virtue of upward forces provided by springs 718 and 755. As will be shown in FIG. 9D, latch assembly 800 will eventually be pushed downwards and spring 755 will compress.

Shoulder screws 790 and shoulder screws 716, which are threaded into latch assembly 800, limit the amount of upward and downward movement of latch assembly 800 relative to cylinder 610 and piston 620. Thus, while spring 755 urges latch assembly 800 upwards, spring 718 also urges latch assembly 800 upwards by virtue of force provided by spring 718 between screw 716 and piston 620. Spring 718 simultaneously urges piston 620 downwards, but without sufficient force to overcome the fluid pressure in lower chamber 764.

In FIG. 9A, it is noted that first ledge 154 and second ledge 156 of pin 150 have not made contact with docking pin receiver 600. Further, section 155 is not yet interacting region 630 of opening 625 to provide fine alignment.

At step 1010, and as shown in FIG. 9B, ball end 152 has moved past projection 803 of catch 802. Thus, catch spring 812 rotates catch 802 counter-clockwise so that projection 803 engages the small space or notch 157 where second ledge 156 meets ball end 152. It is noted in FIG. 9B that there is still a gap between piston 620 and catch 802. Latch assembly 800 is still at a highest position with respect to cylinder 610 and piston 710. Again, lower chamber 764 is filled with pressurized fluid (e.g. air), which still prevents piston 620 from descending within lower chamber 764.

It is also noted in FIG. 9B that sensor plunger 912 is partially compressed. Sensor 900 now indicates that docking pin 150 has sufficiently penetrated docking pin opening 625 so that catch 802 has rotated towards ball end 152. Thus, projection 803 is situated at and interacting with the notch 157 where ball end 152 meets second ledge 156. It is also noted that first ledge 154 of docking pin 150 is now in contact with the top surface of piston ledge 759. Further, alignment surface 155 of pin 150 is seated within alignment receptacle region 630 of piston 710. It is to be noted that when two or more pins 150 are in this state, fine alignment of the test head within three planar degrees of freedom (e.g., X, Y and Theta Z) has been established.

Thus, as shown in FIG. 9B and FIG. 10, at step 1010, ball end 152 has moved past catch projection 803.

At step 1015, sensor 900 continues to detect docking pin 150.

At step 1020, catch projection 803 is now situated directly above a portion of ball end 152. In other words, catch projection 803 now protrudes into the notch 157 created by the intersection of ball end 152 and second ledge 156.

At step 1025, sensor 900 signals the fluid valve (not shown) to remove or vent fluid (e.g. air) from lower chamber 764. This allows piston 620 to move downwards relative to latch assembly 800. Latch assembly 800 is still at its highest position with respect to cylinder 610 by virtue of upward force provided by springs 755.

As shown in FIG. 9C, and as indicated at step 1030, the valve (regulator) 999 has removed fluid from lower chamber 764. Thus, piston base 758 of piston 620 is able to descend within lower chamber 764. Indeed, with fluid pressure in lower chamber 764 reduced to approximately atmospheric pressure, spring 718 is able to urge piston 620 downwards. As piston 620 moves downwards, piston rabbet 710 now comes into contact with and interacts with the top surface of catch 802 (step 1035). Catch 802 is thus locked in place and is no longer able to rotate. Because projection 803 is locked into a location directly above a portion of ball end 152, docking pin 150 can no longer be withdrawn from docking pin opening 625. As all of the catches 802 perform in the same way, pin 150 has essentially been grasped in a claw-like manner. The descent of piston 620 enlarges small upper chamber 766 between piston 620 and cap 880; also, lower chamber 764 has accordingly and correspondingly contracted.

Because pressurized fluid (e.g. air) is removed from lower chamber 764 catch assembly 800 and piston 620 now move in unison with respect to cylinder 610 by virtue of upward forces provided by springs 716 and 755 as well as piston rabbet 710 and catch 802 being locked together. It should be noted that sensor 900 can also be used to monitor this relative movement with respect to cylinder 610 which may be advantageously used to signal that, perhaps due to uncontrolled external conditions, docking pin 150 has been forced to travel too far downwards, leading to potential damage. Upon such a signal, a system controller may, for example, initiate an immediate undocking procedure as will be subsequently described.

Because piston 620 has moved closer to latch unit 800, springs 718 are now lengthened as they urge piston 620 downwards. Latch 800 is still urged upwards by springs 755 and remains at its highest point within piston 620 and inner cavity 772 of cylinder 610.

As shown in FIG. 9D, pressurized fluid (e.g. air) has been injected into upper chamber 766 while lower chamber 764 has remained vented. Thus, piston base 750 and piston 620 have further descended within lower chamber 764. As a result of piston base 750 being pushed downward, all of piston 620 is pushed downwards. As piston 620 is pushed downwards, piston rabbet 710 pushes latch 802 downwards, which in turn pulls docking pin 150 downwards, towards its final docked position. Thus, latch unit 800 descends within inner cavity 772. Motion must stop when piston base 750 touches the bottom of cylinder 610 making lower chamber 764 its minimum volume.

Also, because sensor 900 has been further compressed, sensor 900 signals that docking pin 150 has reached the lowest desirable level of insertion within docking pin opening 625. Thus, at step 1040, piston 620 has moved downward further and catch 802 has moved down further causing docking pin 150 to be pulled down further into opening 625. At this point docking has been completed FIG. 9E illustrates the beginning of undocking of test head from the peripheral. As shown in FIG. 9E, pressurized fluid has been injected into lower chamber 764 while upper chamber 766 has been vented, thus causing piston base 750 and piston 620 to rise. As piston 620 rises, springs 755 urge latch unit 800 upwards. Latch unit 800 reaches its highest level when shoulder screws 790 stop against the bottom surface of cylinder 610. Piston 620, however, continues to rise further so that piston rabbet 710 is no longer in contact with catch 802. As piston rabbet 710 is no longer in contact with catch 802, catch 802 is now free to rotate so that docking pin 150 can be withdrawn from docking pin opening 625.

Although illustrated and described herein with reference to certain specific embodiments, the present invention is nevertheless not intended to be limited to the details shown. Rather, various modifications may be made in the details within the scope and range of equivalence of the claims and without departing from the spirit of the invention.

The invention claimed is:

1. A method of docking a test head to a peripheral, said method comprising the steps of:
   moving a docking pin in a direction of motion through an opening in a piston and past a projection in a catch;

further moving the docking pin until a) the catch rotates towards the docking pin, b) the projection in the catch engages a notch or indentation in the docking pin, and c) the docking pin is seated within the opening so that lateral motion of the docking pin relative to the opening is prevented;

moving the piston onto the catch so that the catch is prevented from rotating; and further moving the piston after moving the piston onto the catch so that the test head is docked to the peripheral.

2. Apparatus for docking a test head to a peripheral wherein a docking pin is coupled to the test head on the peripheral, said apparatus comprising:

a rotatable catch having a projection a spring like member which urges said projection towards said docking pin a piston which includes an opening having a size which prevents lateral movement of said docking pin in said opening, said piston a) moves downward and engages said rotatable catch in order to prevent said projection from rotating away from said docking pin and then b) moves further downward with said rotatable catch after said piston engages said rotatable catch.

3. Apparatus according to claim 2, further comprising a sensor for detecting presence of said docking pin.

4. Apparatus according to claim 2, further comprising a latch unit on which said catch pivots;

a cylinder; and a spring like member which enables said latch unit to move relative to said cylinder.

5. Apparatus according to claim 4, wherein said cylinder includes an inner ring which guides said latch unit up and down.

6. Apparatus according to claim 4, wherein said piston is movable upward and downward relative to the cylinder, the cylinder includes an inner cavity and an outer cavity outside of the inner cavity, the piston operates in the outer cavity.

7. Apparatus according to claim 2, further comprising a sensor for detecting presence of said docking pin, and a cylinder in which said piston moves, said cylinder and said piston defining an outer cavity, wherein responsive to said sensor detecting presence of said docking pin, a regulator removes gas from said outer cavity.

8. A method of docking a test head to a peripheral, said method comprising the steps of:

inserting a docking pin into an opening of a piston which aligns said test head with said peripheral, moving said docking pin past a projection of a catch so that said projection urges directly above a portion of said docking pin, lowering said piston so that a) said catch is prevented from moving away from said docking pin; and b) said test head remains aligned with said peripheral further lowering said piston so that said docking pin and said catch move downwards and said test head and said peripheral dock.

9. A method according to claim 8, wherein the catch moves within a cylinder and said piston encloses a cavity of said cylinder, said method further comprising the steps of:

detecting that said docking pin has entered said opening;

responsive to said detecting, removing gas from said cavity;

urging said piston into said cavity so that said piston moves towards said catch and prevents movement of said catch relative to said docking pin.

10. A method of docking a test head to a peripheral comprising the steps of:

providing a plurality of docking pins on one of the test head and peripheral;

providing a plurality of docking pin receivers, each capable of grasping one of said docking pins and each capable of sensing the presence and position of a docking pin within it, on the other of the test head and peripheral, wherein each docking pin receiver with a sensor capable of sensing the presence and position of a docking pin within said receiver;

positioning the test head to a position where said docking pins are in proximity to their respective docking pin receivers;

further positioning the test head so that the pins are inserted into their respective receivers and the pins are prevented from lateral movement in their receivers so that the test head and the peripheral are aligned;

grasping each docking pin by its respective receiver as each receiver detects the presence of its respective pin; and activating the receivers, after grasping each docking pin, to pull the test head into the docked position.

11. A method of docking a test head to a peripheral according to claim 10, said method further comprising the steps of:

moving one of said docking pins past a projection of a catch included in one of said docking pin receivers so that said projection urges directly above a portion of said one of said docking pins, lowering said piston so that said catch is prevented from moving away from said docking pin.

12. A method of docking a test head to a peripheral according to claim 11, said method further comprising the steps of:

detecting that said docking pin has entered said receiver;

responsive to said detecting, removing gas from said cavity;

urging said piston into said cavity so that said piston moves towards said catch and prevents movement of said catch relative to said docking pin.

13. Method of docking comprising the steps of:

having a docking pin enter an opening in a piston which prevents lateral movement of the docking pin relative to the piston;

having a ball end of said docking pin move past a projection of a catch;

detecting said docking pin;

urging said projection to a location above a ledge of said docking pin;

moving a piston downward so it contacts the catch and prevents movement of the catch; and moving the piston further downward further causing the catch to move downward and pull the docking pin further into the opening.

* * * * *